(12) United States Patent
Nowatari et al.

(10) Patent No.: US 9,012,041 B2
(45) Date of Patent: Apr. 21, 2015

(54) LIGHT-EMITTING ELEMENT, LIGHT-EMITTING DEVICE, ELECTRONIC DEVICE, AND LIGHTING DEVICE

(75) Inventors: Hiromi Nowatari, Kanagawa (JP); Satoshi Seo, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 568 days.

(21) Appl. No.: 13/040,511

(22) Filed: Mar. 4, 2011

(65) Prior Publication Data

US 2011/0215307 A1   Sep. 8, 2011

(30) Foreign Application Priority Data

Mar. 8, 2010 (JP) ................................ 2010-050451

(51) Int. Cl.
 H01L 51/54 (2006.01)
 C09K 11/06 (2006.01)
 H01L 51/50 (2006.01)
 H01L 51/00 (2006.01)

(52) U.S. Cl.
 CPC .......... *H01L 51/5092* (2013.01); *H01L 51/506* (2013.01); *H01L 51/0078* (2013.01); *H01L 51/0072* (2013.01); *H01L 51/5068* (2013.01); *Y10S 428/917* (2013.01)
 USPC ........... 428/690; 428/917; 313/504; 313/506; 257/40; 257/E51.042

(58) Field of Classification Search
 None
 See application file for complete search history.

(56) References Cited

U.S. PATENT DOCUMENTS

| | | | |
|---|---|---|---|
| 5,998,803 A | 12/1999 | Forrest et al. | |
| 6,013,384 A | 1/2000 | Kido et al. | |
| 6,140,763 A | 10/2000 | Hung et al. | |
| 6,579,629 B1 | 6/2003 | Raychaudhuri et al. | |
| 7,192,659 B2 | 3/2007 | Ricks et al. | |
| 7,462,883 B2 | 12/2008 | Kumaki et al. | |
| 7,494,722 B2 | 2/2009 | Liao et al. | |
| 7,560,862 B2 | 7/2009 | Liao et al. | |
| 7,564,052 B2 | 7/2009 | Kumaki et al. | |
| 7,598,670 B2 | 10/2009 | Kumaki et al. | |
| 7,893,427 B2 | 2/2011 | Kumaki et al. | |
| 7,960,038 B2 | 6/2011 | Ohsawa et al. | |
| 7,964,891 B2 | 6/2011 | Kumaki et al. | |
| 8,164,088 B2 | 4/2012 | Ohsawa et al. | |
| 8,368,059 B2 | 2/2013 | Kumaki et al. | |
| 8,368,060 B2 | 2/2013 | Kumaki et al. | |
| 8,618,574 B2 | 12/2013 | Kumaki et al. | |
| 8,729,795 B2 | 5/2014 | Nomura et al. | |
| 8,742,407 B2 | 6/2014 | Ohsawa et al. | |
| 8,872,169 B2 | 10/2014 | Kumaki et al. | |
| 2002/0180347 A1 | 12/2002 | Adachi et al. | |
| 2003/0127967 A1 | 7/2003 | Tsutsui et al. | |
| 2003/0189401 A1 | 10/2003 | Kido et al. | |
| 2004/0227460 A1* | 11/2004 | Liao et al. ................ 313/506 |
| 2004/0262614 A1 | 12/2004 | Hack et al. | |
| 2005/0098207 A1* | 5/2005 | Matsumoto et al. .......... 136/263 |
| 2005/0104511 A1 | 5/2005 | Liao et al. | |
| 2005/0110007 A1 | 5/2005 | Forrest et al. | |
| 2006/0008740 A1 | 1/2006 | Kido et al. | |
| 2006/0087225 A1 | 4/2006 | Liao et al. | |
| 2006/0115673 A1 | 6/2006 | Li | |
| 2006/0188745 A1 | 8/2006 | Liao et al. | |
| 2006/0220534 A1 | 10/2006 | Shibanuma et al. | |
| 2006/0251922 A1 | 11/2006 | Liao et al. | |
| 2006/0263629 A1 | 11/2006 | Aziz et al. | |
| 2006/0292394 A1 | 12/2006 | Iwaki et al. | |
| 2007/0001570 A1* | 1/2007 | Nomura et al. ............... 313/113 |
| 2007/0003788 A1 | 1/2007 | Tagami et al. | |
| 2007/0020483 A1 | 1/2007 | Park et al. | |
| 2007/0040161 A1 | 2/2007 | Kumaki et al. | |
| 2007/0090376 A1 | 4/2007 | Kumaki et al. | |
| 2007/0114512 A1 | 5/2007 | Kumaki et al. | |
| 2007/0114527 A1 | 5/2007 | Kumaki et al. | |
| 2007/0116983 A1 | 5/2007 | Kanno et al. | |
| 2007/0120136 A1 | 5/2007 | Noda et al. | |
| 2007/0129545 A1 | 6/2007 | Inoue et al. | |
| 2007/0182317 A1 | 8/2007 | Kido et al. | |

(Continued)

FOREIGN PATENT DOCUMENTS

| | | |
|---|---|---|
| CN | 101034736 A | 9/2007 |
| EP | 0 977 287 A2 | 2/2000 |

(Continued)

OTHER PUBLICATIONS

Liao, L.S. et al., "High-Efficiency Tandem Organic Light-Emitting Diodes," Applied Physics Letters, vol. 84, No. 2, Jan. 12, 2004, pp. 167-169.

Tsutsui, T. et al., "Electric Field-Assisted Bipolar Charge Spouting in Organic Thin-Film Diiodes," Applied Physics Letters, vol. 84, No. 3, Jan. 19, 2004, pp. 440-442.

Ikeda, H. et al., "P-185: Low-Drive-Voltage OLEDs With a Buffer Layer Having Molybdenum Oxide," SID Digest '06: SID International Symposium Digest of Technical Papers, vol. 37, 2006, pp. 923-926.

Birnstock, J. et al., "54.3: Distinguished Paper: White Stacked OLED With 35 lm/W and 100,000 Hours Lifetime at 1000 cd/m2 for Display and Lighting applications," SID Digest '08 : SID International Symposium Digest of Technical Papers, vol. 39, May 20, 2008, pp. 822-825.

(Continued)

*Primary Examiner* — Andrew K Bohaty
(74) *Attorney, Agent, or Firm* — Husch Blackwell LLP

(57) ABSTRACT

A light-emitting element includes an EL layer between an anode and a cathode, and a first layer, a second layer, and a third layer between the cathode and the EL layer. The first layer provided between the cathode and the second layer is in contact with the cathode and the second layer, and includes a substance having a hole-transport property and an acceptor substance. The second layer provided between the first layer and the third layer is in contact with the first layer and the third layer, and includes a phthalocyanine-based material. The third layer provided between the second layer and the EL layer is in contact with the second layer and the EL layer, and includes an alkali metal, an alkaline-earth metal, a rare-earth metal, an alkali metal compound, an alkaline-earth metal compound, or a rare-earth metal compound.

41 Claims, 18 Drawing Sheets

(56) References Cited

U.S. PATENT DOCUMENTS

| | | |
|---|---|---|
| 2007/0200125 A1 | 8/2007 | Ikeda et al. |
| 2007/0210322 A1* | 9/2007 | Ohsawa et al. ............... 257/79 |
| 2007/0222376 A1 | 9/2007 | Ohsawa et al. |
| 2008/0135858 A1 | 6/2008 | Yamazaki et al. |
| 2008/0278064 A1 | 11/2008 | Kumaki et al. |
| 2009/0102366 A1 | 4/2009 | Ushikubo et al. |
| 2009/0167158 A1* | 7/2009 | Kathirgamanathan et al. ............... 313/504 |
| 2009/0167168 A1 | 7/2009 | Seo et al. |
| 2010/0133523 A1 | 6/2010 | Nowatari et al. |
| 2010/0133573 A1 | 6/2010 | Nowatari et al. |
| 2010/0282309 A1 | 11/2010 | Pschirer et al. |
| 2010/0301316 A1 | 12/2010 | Nowatari et al. |
| 2010/0301317 A1 | 12/2010 | Nowatari et al. |
| 2011/0057179 A1 | 3/2011 | Nowatari et al. |
| 2011/0233530 A1 | 9/2011 | Nowatari et al. |
| 2011/0240971 A1 | 10/2011 | Nowatari et al. |
| 2011/0240972 A1 | 10/2011 | Nowatari et al. |
| 2014/0203266 A1 | 7/2014 | Nomura et al. |
| 2014/0264304 A1 | 9/2014 | Ohsawa et al. |

FOREIGN PATENT DOCUMENTS

| | | |
|---|---|---|
| EP | 1 179 862 A2 | 2/2002 |
| EP | 1 530 245 A2 | 5/2005 |
| EP | 1 624 502 A2 | 2/2006 |
| EP | 1 833 104 A2 | 9/2007 |
| EP | 1 865 566 A1 | 12/2007 |
| JP | 04-297076 A | 10/1992 |
| JP | 10-270171 A | 10/1998 |
| JP | 2000-068063 A | 3/2000 |
| JP | 2002-075658 A | 3/2002 |
| JP | 2003-272860 A | 9/2003 |
| JP | 2005-209643 A | 8/2005 |
| JP | 2007-043104 A | 2/2007 |
| JP | 2007-165171 A | 6/2007 |
| JP | 2007-273969 A | 10/2007 |
| JP | 2008-219033 A | 9/2008 |
| TW | 200618350 | 6/2006 |
| TW | 200947774 | 11/2009 |
| WO | WO 01/15244 A1 | 3/2001 |
| WO | WO 2006/009262 A1 | 1/2006 |
| WO | WO 2007/130047 A1 | 11/2007 |

OTHER PUBLICATIONS

Kanno, H. et al., "High Efficiency Stacked Organic Light-Emitting Diodes Employing Li2O as a Connecting Layer," Japanese Journal of Applied Physics, vol. 45, No. 12, Dec. 7, 2006, pp. 9219-9223.

Nowatari, H. et al., "60.2: Intermediate Connector With Suppressed Voltage Loss for White Tandem OLEDs," SID Digest '09 : SID International Symposium Digest of Technical Papers, vol. 40, May 31, 2009, pp. 899-902.

Chang, C.-C. et al., "Highly Efficient White Organic Electroluminescent Devices Based on Tandem Architecture," Applied Physics Letters, vol. 87, No. 25, Dec. 12, 2005, pp. 253501-1-253501-3.

Kanno, H. et al., "White Stacked Electrophosphorescent Organic Light-Emitting Devices Employing MoO3 as a Charge-Generation Layer," Advanced Materials, vol. 18, No. 3, 2006, pp. 339-342.

Terai, M. et al., "Electric-Field-Assisted Bipolar Charge Generation From Internal Charge Separation Zone Composed of Doped Organic Bilayer," Applied Physics Letters, vol. 90, Feb. 21, 2007, pp. 083502-1-083502-3.

Law, C.W. et al., "Effective Organic-Based Connection Unit for Stacked Organic Light-Emitting Devices," Applied Physics Letters, vol. 89, No. 13, Sep. 28, 2006, pp. 133511-1-133511-3.

Leem, D.-S. et al., "Highly Efficient Tandem p-i-n Organic Light-Emitting Diodes Adopting a Low Temperature Evaporated Rhenium Oxide Interconnecting Layer," Applied Physics Letters, vol. 93, No. 10, Sep. 8, 2008, pp. 103304-1-103304-3.

Lai, S.L. et al., "Copper Hexadecafluorophthalocyanine and Copper Phthalocyanine as a Pure Organic Connecting Unit in Blue Tandem Organic Light-Emitting Devices," Journal of Applied Physics, vol. 101, 2007, pp. 014509-1-014509-4.

Liao, L.S. et al., "Power Efficiency Improvement in a Tandem Organic Light-Emitting Diode," Applied Physics Letters, vol. 92, No. 22, Jun. 2, 2008, pp. 223311-1-223311-3.

Chan, M-Y. et al., "Influences of Connecting Unit Architecture on the Performance of Tandem Organic Light-Emitting Devices," Advanced Functional Materials, vol. 17, No. 14, 2007 , pp. 2509-2514.

Hiramoto, M. et al., "p-i-n Like Behavior in Three-Layered Organic Solar Cells Having a Co-Deposited Interlayer of Pigments," Journal of Applied Physics, vol. 72, No. 8, Oct. 15, 1992, pp. 3781-3787.

Brabec, C.J. et al., "Photovoltaic Properties of Conjugated Polymer/methanofullerene Composites Embedded in a Polystyrene Matrix," Journal of Applied Physics, vol. 85, No. 9, May 1, 1999, pp. 6866-6872.

Matsumoto, T. et al., "27.5L: Late-News Paper: Multiphoton Organic EL Device Having Charge Generation Layer," SID Digest '03 : SID International Symposium Digest of Technical Papers, vol. 34, 2003, pp. 979-981.

Extended European search report for patent application No. 11155565.2; Dated Jan. 28, 2013.

Tanaka, H. et al., "High Efficiency Polarization-Sensitive Organic Photovoltaic Devices," Applied Physics Letters, 2006, vol. 88, No. 25, pp. 253506-1-253506-3 .

Tanaka, H. et al., "Polarization-Sensitive Photodiodes Composed of Organic Multilayer Thin Films," Japanese Journal of Applied Physics, 2005, vol. 44, No. 12, pp. 8676-8678.

Chinese Office Action re Application No. CN 201110063135.9, dated Sep. 28, 2014.

* cited by examiner

LIGHT-EMITTING ELEMENT, LIGHT-EMITTING DEVICE, ELECTRONIC DEVICE, AND LIGHTING DEVICE

BACKGROUND OF THE INVENTION

1. Field of the Invention

The present invention relates to a light-emitting element including an electroluminescence (also referred to as EL) layer (the element also refereed to as an EL element), a light-emitting device including the light-emitting element, and an electronic device and a lighting device each including the light-emitting device.

2. Description of the Related Art

An EL element includes a pair of electrodes and an EL layer provided therebetween. A voltage is applied to the pair of electrodes, so that light is emitted from the EL layer. The EL layer is formed using an organic compound.

Light emission mechanism of the EL element will be described. Upon applying voltage to the pair of electrodes, electrons injected from the cathode and holes injected from the anode are recombined in a light-emission center of the EL layer. As a result of the recombination, energy is released so that light is emitted. Light emission is classified into emission from a singlet excited state and emission from a triplet excited state.

Light-emitting elements have various problems, one of which is how to reduce the driving voltage.

According to Patent Document 1, an organic compound of an electron injection layer in contact with a cathode is doped with a metal having a low work function such as an alkali metal, an alkaline earth metal, or a rare earth metal. Such a doping with the metal having a low work function lowers the barrier against electron injection from the cathode to the electron injection layer, thereby reducing the driving voltage.

According to Patent Document 2, optical adjustment of an emission spectrum can be performed without increasing driving voltage. Specifically, a layer in which an organic compound having a hole-transport property is doped with a mental oxide is provided between a cathode and an EL layer of a light-emitting element so as to be in contact with the cathode. Further, so as to be in contact with the metal oxide-doped layer, a layer in which an organic compound having an electron-transport property is doped with a metal having a low work function such as an alkali metal, an alkaline earth metal, or a rare earth metal is provided. The thickness of the metal oxide-doped layer is adjusted so that an increase of the driving voltage is suppressed and optical adjustment of emission is performed.

REFERENCES

Patent Document 1: Japanese Published Patent Application No. H10-270171
Patent Document 2: Japanese Published Patent Application No. 2005-209643

SUMMARY OF THE INVENTION

According to Patent Document 2, the layer in which the organic compound having a hole-transport property is doped with the mental oxide is in contact with the layer in which the organic compound having an electron-transport property is doped with the metal having a low work function such as an alkali metal, an alkaline earth metal, or a rare earth metal. The organic compound having a hole-transport property is a donor substance and the metal oxide is an acceptor substance. The metal having a low work function is a donor substance and the organic compound having an electron-transport property is an acceptor substance. Therefore, the layer doped with the acceptor substance is in contact with the layer doped with the donor substance.

When the layer doped with the acceptor substance is in contact with the layer doped with the donor substance, a pn junction is formed to form a depletion layer. Further, the acceptor substance interacts with the donor substance, so that the function of the acceptor substance and the function of the donor substance are blocked. Accordingly, an increase of the driving voltage is caused.

It is an object of one embodiment of the present invention to provide a light-emitting element in which an increase of driving voltage can be suppressed. In addition, it is another object to provide a light-emitting device whose power consumption is reduced by the light-emitting element included.

It is an object of one embodiment of the present invention to suppress an increase of driving voltage in a light-emitting element including a layer including an acceptor substance and a layer including a donor substance. In addition, it is another object to provide a light-emitting device whose power consumption is reduced by the light-emitting element included.

A light-emitting element according to a first embodiment of the present invention includes an EL layer between an anode and a cathode, and a first layer, a second layer, and a third layer between the cathode and the EL layer. The first layer is provided between the cathode and the second layer and in contact with the cathode and with the second layer, and includes a substance having a hole-transport property and an acceptor substance with respect to the substance having a hole-transport property. The second layer is provided between the first layer and the third layer and in contact with the first layer and with the third layer, and includes a phthalocyanine-based material. The third layer is provided between the second layer and the EL layer and in contact with the second layer and with the EL layer, and includes an alkali metal, an alkaline-earth metal, a rare-earth metal, an alkali metal compound, an alkaline-earth metal compound, or a rare-earth metal compound. As an example of the phthalocyanine-based material, a metal phthalocyanine-based material such as CuPc, H$_2$Pc, SnPc, ZnPc, CoPc, or FePc can be given. Structural formulae of the phthalocyanine-based materials are illustrated below.

(Chemical Formula 1)

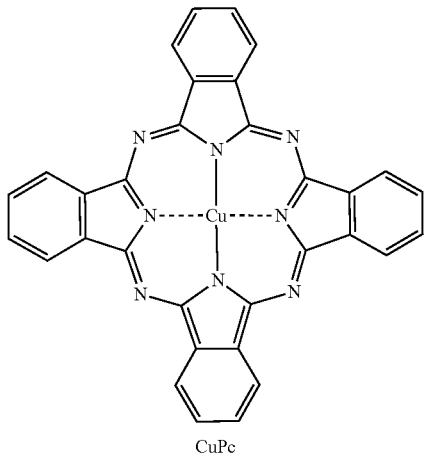

CuPc

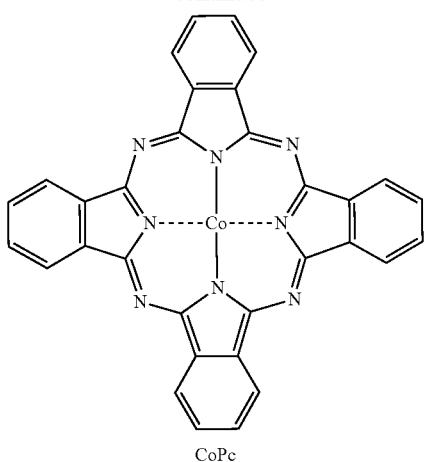

CoPc

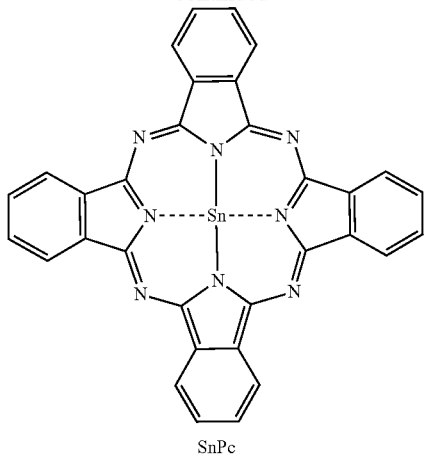

SnPc

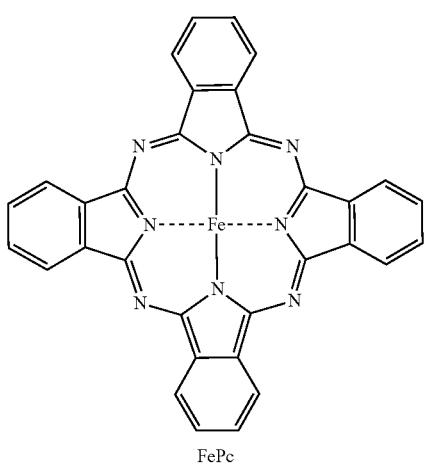

FePc

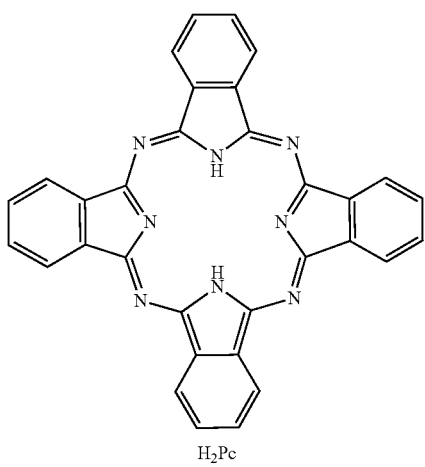

H₂Pc

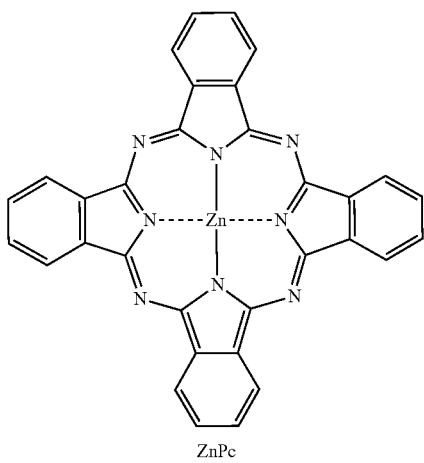

ZnPc

Alternatively, the phthalocyanine-based material is preferably phthalocyanine-based material (also referred to as a phthalocyanine derivative). As a example of the phthalocyanine-based material having a phenoxy group, PhO-VOPc (vanadyl 2,9,16,23-tetraphenoxy-29H,31H-phthalocaynine; produced by Synthon BV) can be given. A structural formula of the phthalocyanine-based material having a phenoxy group is shown below.

(Chemical Formula 2)

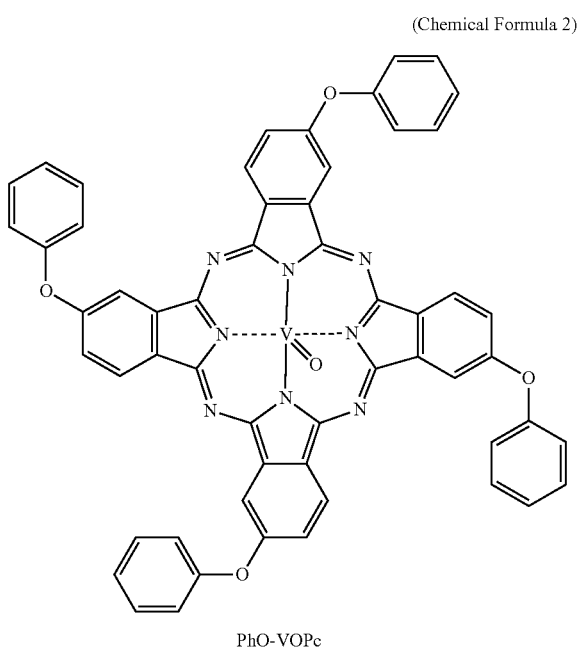

PhO-VOPc

The second layer has a substance having an electron-transport property with a LUMO level (preferably, greater than or equal to −5.0 eV, far preferably greater than or equal to −5.0 eV and less than or equal to −3.0 eV) which is higher than the acceptor level of the acceptor substance included in the first layer, which facilitates electron move from the first layer to the second layer. Accordingly, with the second layer, an increase in the driving voltage of the light-emitting element can be suppressed. The first layer contains an acceptor substance and a donor substance, and the third layer contains at least a donor substance. However, since the second layer is provided between the first layer and the third layer, it is possible to prevent formation of a pn junction and formation of a depletion layer. Further, it is also possible to prevent interaction between the layer containing an acceptor substance and the layer containing a donor substance. Note that in the case where the phthalocyanine-based substance is used for the second layer, formation of a pn junction and formation of a depletion layer can be prevented even if a donor substance is contained in the second layer.

In a preferable example of the light-emitting element according to the first embodiment of the present invention, the second layer contains an alkali metal, an alkaline-earth metal, a rare-earth metal, an alkali metal compound, an alkaline-earth metal compound, or a rare-earth metal compound. The metal or compound serves as a donor substance in the second layer, and a donor level is formed. The donor level affects the LUMO level of the second layer, which facilitate electron move from the acceptor level of the first layer to the LUMO level of the second layer. Thus, electrons can be easily injected into the EL layer, so that an increase in the driving voltage of the light-emitting element can be suppressed.

In the second layer, the metal or compound may be added so that the mass ratio of the metal or compound to the phthalocyanine-based material is greater than or equal to 0.001:1 and less than or equal to 0.1:1. Accordingly, the above effect can be enhanced.

In a preferable example of the light-emitting element according to the first embodiment of the present invention, the third layer contains a substance having an electron-transport property. The third layer reduces a barrier against electron injection into the EL layer. The substance having an electron-transport property contained in the third layer enables electrons to be efficiently transported in the third layer.

In the third layer, an alkali metal, an alkaline-earth metal, a rare-earth metal, an alkali metal compound, an alkaline-earth metal compound, or a rare-earth metal compound may be added so that the mass ratio of the metal or compound to the substance having an electron-transport property is greater than or equal to 0.001:1 and less than or equal to 0.1:1. Accordingly, the above effect can be enhanced.

In a preferable example of the light-emitting element according to the first embodiment of the present invention, the EL layer includes a fourth layer containing a substance having an electron-transport property and the fourth layer is in contact with the third layer. Accordingly, the above effect can be enhanced.

In a preferable example of the light-emitting element according to the first embodiment of the present invention, the first layer contains the acceptor substance so that the mass ratio of the acceptor substance to the substance having a high hole-transport property is greater than or equal to 0.1:1 and less than or equal to 4.0:1. In that case, the first layer, which serves as a charge generation region, can efficiently generate charges. Further, this case enhances the effect that an increase in the thickness of the first layer does not cause a large variation in its conductivity. Because the conductivity of the first layer does not vary much, adjustment of its thickness enables optical adjustment of light emission without involving an increase in the driving voltage. This effect can be enhanced with that case.

In a preferable example of the light-emitting element according to the first embodiment of the present invention, the first layer has a stack structure of a layer containing the substance having a hole-transport property and a layer containing the acceptor substance. A charge-transfer complex is formed in the first layer, and charges are generated by the charge-transfer complex. Further, the charge-transfer complex exhibits a light absorption property in the visible region. In this case, because the charge-transfer complex is formed only at an interface, the possibility of absorption of light emission from the EL layer can be reduced.

In a preferable example of the light-emitting element according to the first embodiment of the present invention, the EL layer includes a fifth layer containing a substance having a hole-transport property and an acceptor substance with respect to the substance having a hole-transport property, and the fifth layer is in contact with the anode. The fifth layer serves as a charge generation region like the first layer. By providing the charge generation regions on the cathode side and the abode side, carrier balance can be improved. Further, when the layer in contact with the cathode and the layer in contact with the anode have the same structures, the balance of stress can be improved.

The fifth layer may contain the acceptor substance such that the mass ratio of the acceptor substance to the substance having a high hole-transport property is greater than or equal to 0.1:1 and less than or equal to 4.0:1. In that case, charges can be efficiently generated. Further, that case enhances the effect that an increase in the thickness of the fifth layer does not cause a large variation in its conductivity. Because the conductivity of the fifth layer does not vary much, adjustment of its thickness enables optical adjustment of light emission without involving an increase in the driving voltage. This effect can be enhanced with that case.

The fifth layer may have a stack structure of a layer containing the substance having a hole-transport property and a layer containing the acceptor substance. A charge-transfer complex is formed in the fifth layer, and charges are generated by the charge-transfer complex. Further, the charge-transfer complex exhibits a light absorption property in the visible region. In that case, because the charge-transfer complex is formed only at an interface, the possibility of absorption of light emission from the EL layer can be reduced.

In a preferable example of the light-emitting element according to the first embodiment of the present invention, the acceptor substance included in the first layer is an oxide of a metal belonging to Group 4 to Group 8 in the periodic table. Accordingly, the function as a charge generation region is enhanced.

In a preferable example of the light-emitting element according to the first embodiment of the present invention, the acceptor substance included in the first layer is molybdenum oxide. Accordingly, the effect as the charge generation region is enhanced and the hygroscopic property is reduced.

A light-emitting device may be formed using the above light-emitting element. An electronic device or a lighting device may also be formed using the light-emitting device. With such an application, the effect can be enhanced.

The light-emitting device includes in its category an image display device, a luminescent device, and a light source (including a lighting system). In addition, the following modules are also included in its category: modules provided with a connector, for example, a flexible printed circuit (FPC), a tape automated bonding (TAB) tape, or a tape carrier package (TCP); modules provided with a printed wiring board at the end of a TAB tape or a TCP; and modules where an integrated circuit (IC) is directly mounted on a light-emitting element by a chip-on-glass (COG) method.

In the light-emitting element according to the first embodiment of the present invention, an increase of the driving voltage can be suppressed by the second layer. The second layer provided between the first layer and the third layer can prevent formation of a pn junction and formation of a depletion layer. In addition, interaction between the first layer and the third layer can be prevented. Further, light-emitting devices, electronic devices and lighting devices with less power consumption can be provided by including the light-emitting element.

DETAILED DESCRIPTION OF THE INVENTION

Hereinafter, embodiments and examples of the present invention will be described with reference to drawings. However, the present invention is not limited to the following description, and the mode and details can be variously changed unless departing from the scope and spirit of the present invention. Therefore, the present invention is not construed as being limited to the following description of the embodiments and examples.

Embodiment 1

In Embodiment 1, an element structure of a light-emitting element according to one embodiment of the present invention will be described with reference to FIGS. 1A and 1B and FIG. 2.

Figure 1A:
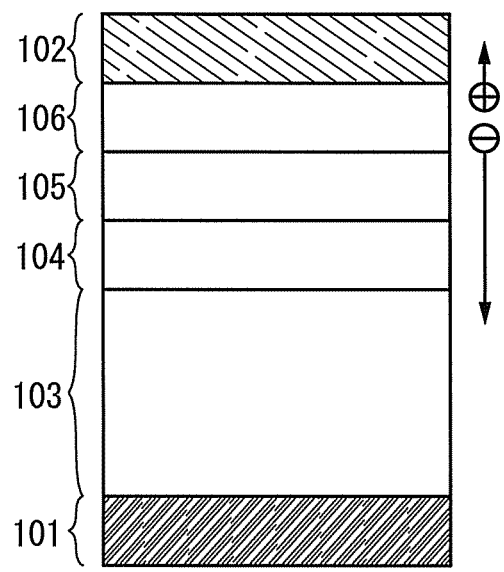
FIGS. 1A and 1B illustrate an element structure of a light-emitting element and a band diagram thereof.
Figure 2:
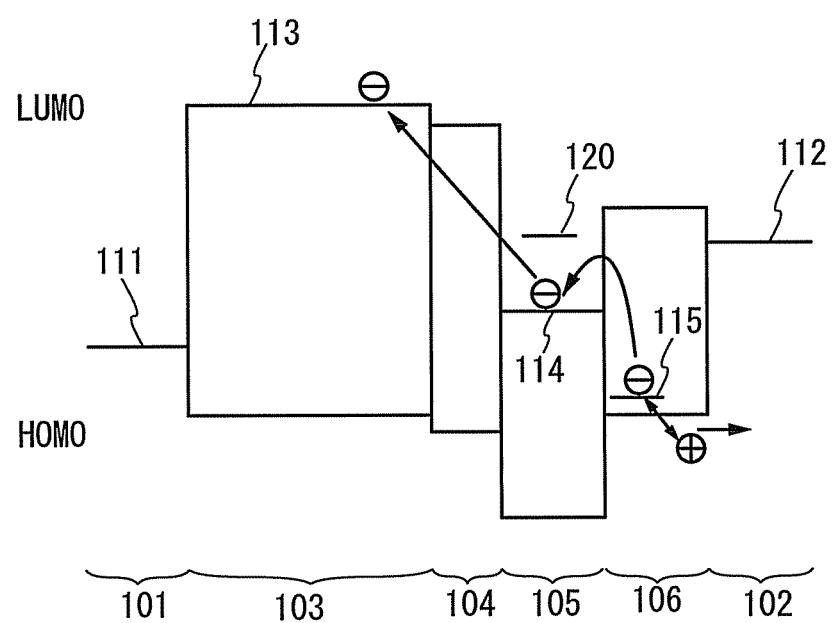
FIG. 2 illustrates a band diagram of a light-emitting element.

In a light-emitting element illustrated in FIG. 1A, an EL layer 103 including a light-emitting region is provided between a pair of electrodes (an anode 101 and a cathode 102), and a first layer 106, a second layer 105, and a third layer 104 are stacked in this order from the cathode 102 side between the cathode 102 and the EL layer 103.

The first layer 106 is provided between the cathode 102 and the second layer 105, and in contact with the cathode 102 and with the second layer 105. The first layer 106 contains a substance having a hole-transport property and an acceptor substance with respect to the substance having a hole-transport property and serves as a charge generation region. Holes and electrons are considered to be generated in such a manner that the substance having a hole-transport property and the acceptor substance form a charge-transfer complex and the acceptor substance draws electrons from the substance having a hole-transport property. The first layer 106 has a thickness greater than or equal to 10 nm and less than or equal to 200 nm. Even if the thickness of the first layer 106 is increased, a variation in its conductivity is small, which leads that an increase in the driving voltage of the light-emitting element can be suppressed. Adjustment of the thickness of the first layer 106 enables optical adjustment of light emission without involving an increase in driving voltage.

The second layer 105 is provided between the first layer 106 and the third layer 104, and in contact with the first layer 106 and with the third layer 104. The second layer 105 contains a phthalocyanine-based material, and receives electrons generated in the first layer 106 and passes to the third layer 104. Thus, the second layer 105 serves as an electron relay layer. As an example of the phthalocyanine-based material, a metal phthalocyanine-based material such as CuPc, H₂Pc, SnPc, ZnPc, CoPc, or FePc can be given. The second layer 105 prevents interaction between the first layer 106 and the third layer 104. The second layer 105 can prevent formation of a pn junction and formation of a depletion layer. The second layer 105 can suppress an increase of the driving voltage of the light-emitting element. The above-described phthalocyanine-based materials are illustrated below.

(Chemical Formula 3)

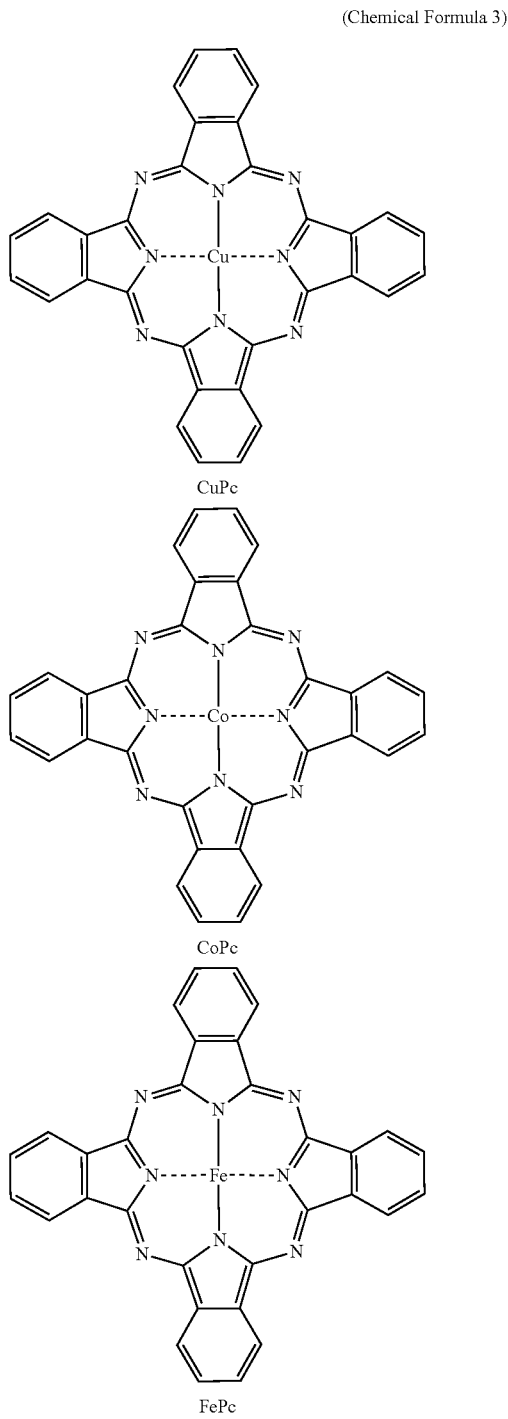

CuPc

CoPc

FePc

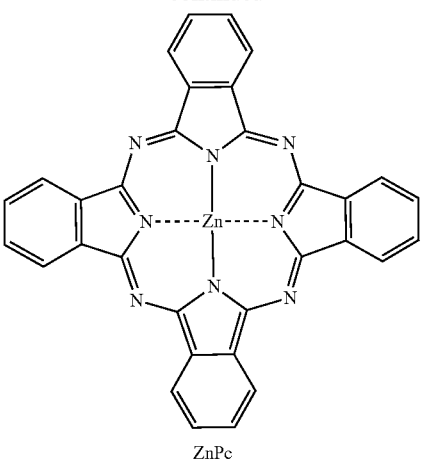

ZnPc

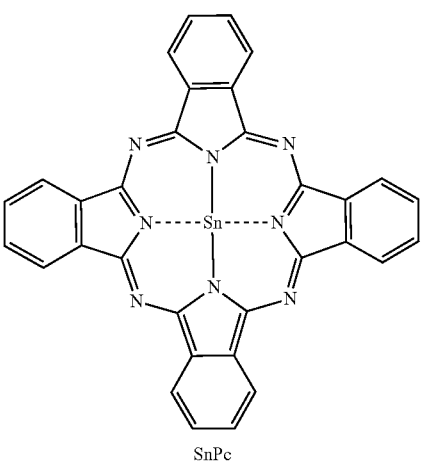

SnPc

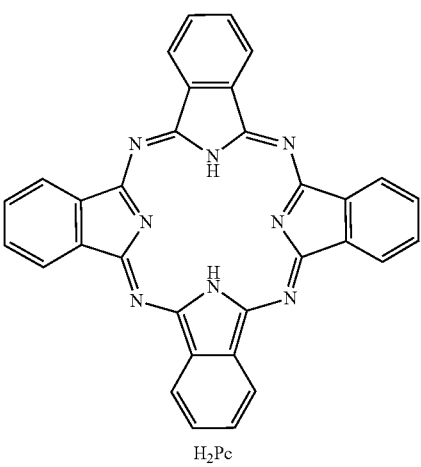

H₂Pc

Alternatively, specifically, the phthalocyanine-based material is preferably PhO-VOPc (vanadyl 2,9,16,23-tetraphenoxy-29H,31H-phthalocaynine; produced by Synthon BV) whose structural formula is shown below. The phthalocyanine material shown below is a phthalocyanine derivative having a phenoxy group. The phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

(Chemical Formula 4)

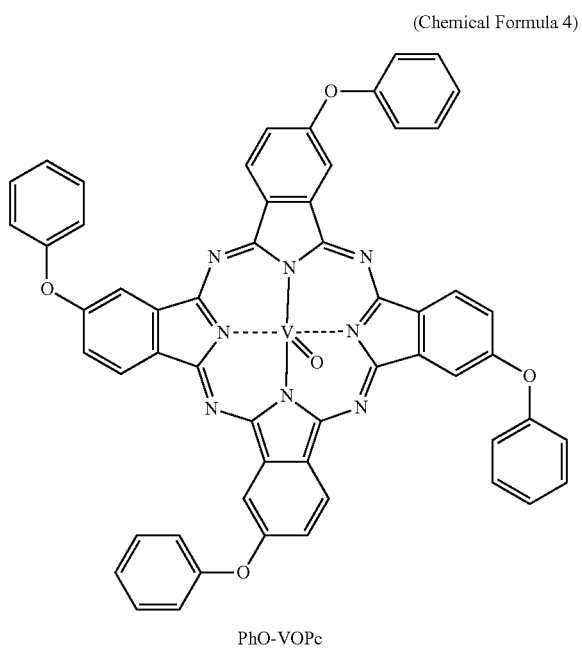

PhO-VOPc

The third layer 104 is provided between the second layer 105 and the EL layer 103, and in contact with the second layer 105 and with the EL layer 103. The third layer 104 contains an alkali metal, an alkaline-earth metal, a rare-earth metal, an alkali metal compound, an alkaline-earth metal compound, or a rare-earth metal compound, and passes electrons received from the second layer 105 to the EL layer 103. The third layer serves as an electron-injection buffer layer.

In the first layer 106, holes and electrons which are carriers of the light-emitting element are generated. The holes move to the cathode 102 and the electrons move to the second layer 105. Because of its high electron-transport property, the second layer 105 immediately transports the electrons to the third layer 104. The third layer 104 can reduce a barrier against electron injection into the EL layer 103. In this manner, the efficiency of the electron injection into the EL layer 103 can be increased. Hereinafter, description thereof is given using band diagrams.

Figure 1B:
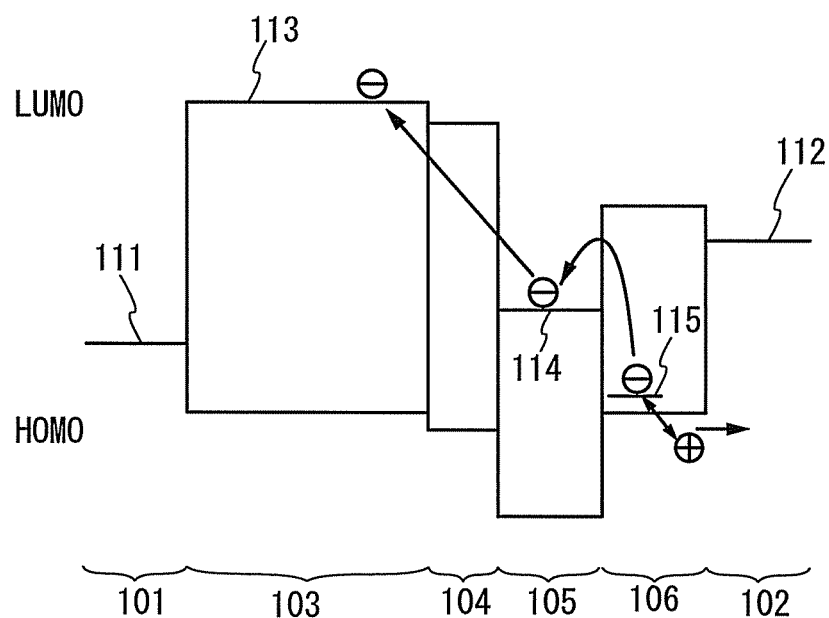

FIG. 1B is a band diagram of the element structure shown in FIG. 1A. In FIG. 1B, reference numeral 111 denotes the Fermi level of the anode 101; 112, the Fermi level of the cathode 102; 113, the LUMO (lowest unoccupied molecular orbital) level of the EL layer 103; 114, the LUMO level of the second layer 105; and 115, the acceptor level of the acceptor substance in the first layer 106.

In order that the second layer 105 can efficiently inject electrons generated in the first layer 106 into the EL layer 103, the LUMO level 114 of the second layer 105 occupies a level between the acceptor level 115 of the acceptor substance in the first layer 106 and the LUMO level 113 of the EL layer 103, and is specifically greater than or equal to −5.0 eV and less than or equal to −3.0 eV. Further, the second layer 105 prevents interaction between the first layer 106 and the third layer 104 and prevents formation of a pn junction and formation of a depletion layer, thereby suppressing an increase in the driving voltage of the light-emitting element.

Injection of the electrons, which are moved from the acceptor level 115 of the first layer 106 to the LUMO level 114 of the second layer 105, into the LUMO level 113 of the EL layer 103 is facilitated because the injection barrier is reduced by the third layer 104. The electrons recombine with holes injected from the anode 101, and the EL layer 103 emits light. On the other hand, the holes generated in the first layer 106 move to the cathode 102.

The second layer 105 contains the phthalocyanine-based material as described above, and may contain an alkali metal, an alkaline-earth metal, a rare-earth metal, an alkali metal compound, an alkaline-earth metal compound, or a rare-earth metal compound. The metal or metal compound serves as a donor substance for the phthalocyanine-based material. A band diagram of that case is FIG. 2. Reference numeral 120 denotes the donor level of the donor substance in the second layer 105. The donor level 120 occupies a level between the acceptor level 115 of the acceptor substance in the first layer 106 and the LUMO level 113 of the EL layer 103, and is specifically greater than or equal to −5.0 eV and less than or equal to −3.0 eV.

The donor level 120 affects the LUMO level 114 of the second layer 105. Electrons can easily move from the acceptor level 115 of the first layer 106 to the LUMO level 114 of the second layer 105. The electrons which are moved to the LUMO level 114 of the second layer 105 are easily injected into the LUMO level 113 of the EL layer 103, because the injection barrier is reduced by the third layer 104. Thus, in the case where the second layer 105 contains the metal or metal compound, electron injection into the EL layer 103 can be further facilitated, so that an increase in the driving voltage of the light-emitting element can be suppressed.

Materials and the like used for the first layer 106, the second layer 105, and the third layer 104 are described below.

The first layer 106 contains the substance having a hole-transport property and the acceptor substance and serves as a charge generation region. The substance having a hole-transport property can be any of a variety of organic compounds such as aromatic amine compounds, carbazole derivatives, aromatic hydrocarbons, and high molecular compounds (e.g., oligomers, dendrimers, and polymers). Specifically, a substance having a hole mobility of $10^{-6}$ $cm^2/Vs$ or more is preferably used. Any other substance that has a property of transporting more holes than electrons may be used as well.

Specific examples of the aromatic amine compounds are 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA) 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), N,N'-bis(4-methylphenyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 1,3,5-tris[N-(4-diphenylaminophenyl)-N-phenylamino]benzene (abbreviation: DPA3B), and the like.

Specific examples of the carbazole derivatives are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. In addition, 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Specific examples of the aromatic hydrocarbons are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. As well as these substances, pentacene, coronene, or the like can be used. In this way, it is more preferable to use an aromatic hydrocarbon which has a hole mobility of $1 \times 10^{-6}$ cm$^2$/Vs or more and which has 14 to 42 carbon atoms.

The aromatic hydrocarbon may have a vinyl skeleton. Examples of the aromatic hydrocarbons having a vinyl group are 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Alternatively, a high molecular compound such as poly(N-vinylcarbazole) (abbreviation: PVK) or poly(4-vinyltriphenylamine) (abbreviation: PVTPA) can be used.

As an example of the acceptor substance used for the first layer 106, a transition metal oxide can be given. In addition, oxides of metals that belong to Group 4 to Group 8 in the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. In particular, molybdenum oxide is preferable because of its low hygroscopic property. In addition, 7,7,8,8-tetracyano-2,3,5,6-tetrafluoroquinodimethane (abbreviation: $F_4$-TCNQ) and chloranil can be given.

It is preferable that the acceptor substance be added to the first layer 106 so that the mass ratio of the acceptor substance to the substance having a hole-transport property is greater than or equal to 0.1:1 and less than or equal to 4.0:1.

The first layer 106 is not limited to the structure in which the substance having a hole-transport property and the acceptor substance are contained in one film, but may have a stack structure of a layer containing the substance having a hole-transport property and a layer containing the acceptor substance. In the case of the stack structure, the layer containing the substance having a high hole-transport property is in contact with the cathode 102.

The first layer 106 has a thickness greater than or equal to 10 nm and less than or equal to 200 nm. Even if the thickness of the first layer 106 is increased, a variation in its conductivity is small, which leads that an increase in the driving voltage of the light-emitting element can be suppressed. Adjustment of the thickness of the first layer 106 enables optical adjustment of light emission without involving an increase in driving voltage.

The second layer 105 immediately receives electrons drawn by the acceptor substance in the first layer 106. The second layer 105 contains the phthalocyanine-based material, and the LUMO level thereof occupies a level between the acceptor level of the acceptor substance in the first layer 106 and the LUMO level of the EL layer 103. Specifically, the LUMO level is preferably greater than or equal to −5.0 eV and less than or equal to −3.0 eV, and any of CuPc, $H_2$Pc, SnPc, ZnPc, CoPc, and FePc is used.

In the second layer 105, the donor substance may be added so that the mass ratio of the donor substance to the phthalocyanine-based material is greater than or equal to 0.001:1 and less than or equal to 0.1:1. As examples of the donor substance, the following substances are given: alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)), in addition to organic compounds such as tetrathianaphthacene (abbreviation: TTN), nickelocene, and decamethylnickelocene.

The second layer 105 has a thickness greater than or equal to 1 nm and less than or equal to 10 nm. The second layer 105 prevents interaction between the first layer 106 and the third layer 104, and prevents formation of a pn junction and formation of a depletion layer, thereby suppressing an increase in the driving voltage of the light-emitting element. Thus, the addition of the donor substance enables electron injection into the EL layer 103 to be further facilitated, so that an increase in the driving voltage of the light-emitting element can be suppressed.

The third layer 104 injects the electrons received by the second layer 105 into the EL layer 103. For the third layer 104, any of the following substances having a high electron-injection property is used: alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)).

In the case where the third layer 104 also contains a substance having an electron-transport property, the substance having a high electron-injection property is preferably added so that the mass ratio of the substance having a high electron-injection property to the substance having an electron-transport property is greater than or equal to 0.001:1 and less than or equal to 0.1:1.

As the substance having an electron-transport property, any of the following metal complexes having a quinoline skeleton or a benzoquinoline skeleton can be used: tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)(4-phenylphenolato) aluminum (abbreviation: BAlq), and the like. Any of the following metal complexes having an oxazole-based ligand or a thiazole-based ligand can be used as well: bis[2-(2-hydroxyphenyl)benzoxazolato]zinc (abbreviation: Zn(BOX)$_2$), bis[2-(2-hydroxyphenyl)benzothiazolato]zinc (abbreviation: Zn(BTZ)$_2$), and the like. Other than the metal complexes, the following can be used as well: 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 9-[4-(5-phenyl-1,3,4-oxadiazol-2-yl)phenyl]carbazole (abbreviation: CO11); 3-(4-biphenylyl)-4-phenyl-5-(4-tert-biphenylyl)-1,2,4-triazole (abbreviation: TAZ); bathophenanthroline (abbreviation: BPhen); bathocuproine (abbreviation: BCP); or the like. The substances described here are mainly substances having an electron mobility of $10^{-6}$ cm$^2$/Vs or more. Any other substance that has a property of transporting more electrons than holes may be used as well. Further, the electron-transport layer is not limited to a single layer, and may be a stack of two or more layers containing any of the above substances. A high molecular compound such as poly[(9,9-dihexylfluorene-2,7-diyl)-co-(pyridine-3,5-diyl)] (abbreviation: PF-Py) or poly[(9,9-dioctyllfluorene-2,7-diyl)-co-(2,2'-bipyridine-6,6'-diyl)] (abbreviation: PF-BPy) can be used as well.

The third layer 104 has a thickness greater than or equal to 0.1 nm and less than or equal to 10 nm. Since the third layer 104 can reduce the injection barrier between the first layer 106 and the EL layer 103, injection of the electrons generated in the first layer 106 into the EL layer 103 can be facilitated.

The first layer 106, the second layer 105, and the third layer 104 can be formed by any of a variety of methods such as a dry process (e.g., a vacuum evaporation method) or a wet process (e.g., an inkjet method or a spin coating method).

Next, other structures in the light-emitting element are described.

For the anode 101, a metal, an alloy, an electrically-conductive compound, a mixture thereof, or the like which has a high work function (specifically, a work function of 4.0 eV or more) is preferably used. Specific examples thereof are indium oxide-tin oxide (ITO: indium tin oxide), indium tin oxide containing silicon or silicon oxide, indium oxide-zinc oxide (IZO: indium zinc oxide), indium oxide containing tungsten oxide and zinc oxide, and the like.

Although the anode 101 is generally formed by sputtering, it may be formed by applying a sol-gel method or the like. For example, a film of indium oxide-zinc oxide (IZO) can be formed by a sputtering method using a target in which 1 wt % to 20 wt % of zinc oxide is added to indium oxide. A film of indium oxide containing tungsten oxide and zinc oxide can be formed by a sputtering method using a target in which 0.5 wt % to 5 wt % of tungsten oxide and 0.1 wt % to 1 wt % of zinc oxide are added to indium oxide.

For the anode 101, any of the following substances may be used: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. A conductive polymer such as poly(3,4-ethylenedioxythiophene)/poly(styrenesulfonic acid) (PEDOT/PSS) and polyaniline/poly(styrenesulfonic acid) (PAni/PSS) may be used as well. Note that, in the case where a fifth layer described later is provided in contact with the anode 101, any of a variety of conductive materials such as Al and Ag can be used for the anode 101 regardless of the work function.

For the cathode 102, a metal, an alloy, an electrically-conductive compound, a mixture of these materials, or the like which has a low work function (preferably, a work function of 3.8 eV or less) can be used. For example, any of the following can be used: elements that belong to Group 1 or Group 2 in the periodic table, that is, alkali metals such as lithium (Li) and cesium (Cs) and alkaline-earth metals such as magnesium (Mg), calcium (Ca), and strontium (Sr), and alloys thereof (e.g., MgAg and AlLi); rare-earth metals such as europium (Eu) and ytterbium (Yb), and alloys thereof; and the like. Note that a film of an alkali metal, an alkaline-earth metal, or an alloy thereof can be formed by a vacuum evaporation method. A film of an alloy containing an alkali metal or an alkaline-earth metal can also be formed by a sputtering method. A film of a silver paste or the like can also be formed by an inkjet method or the like.

Alternatively, the cathode 102 can also be formed with a stack of a thin film of an alkali metal compound, an alkaline-earth metal compound, or a rare-earth metal compound (e.g., lithium fluoride (LiF), lithium oxide (LiOx), cesium fluoride (CsF), calcium fluoride ($CaF_2$), or erbium fluoride ($ErF_3$)) and a film of a metal such as aluminum. However, in the case where the first layer 106 serving as a charge generation region is provided in contact with the cathode 102 as in the structure of this embodiment, a variety of conductive materials such as Al, Ag, ITO, and indium oxide-tin oxide containing silicon or silicon oxide can be used for the cathode 102 regardless of the work function.

In the light-emitting element described in this embodiment, at least one of the anode and the cathode has a property of transmitting visible light. The light-transmitting property can be provided with use of a light-transmitting electrode such as ITO, or a reduction in the thickness of an electrode.

The EL layer 103 includes at least a light-emitting layer, and may have a structure in which a layer/layers other than the light-emitting layer is/are stacked on the light-emitting layer. Other than the light-emitting layer, layers including any of the following substances can be given as examples: a substance having a hole-injection property, a substance having a hole-transport property, a substance having an electron-transport property, a substance having an electron-injection property, a substance having a bipolar property (a substance having a high electron-transport property and a high hole-transport property), and the like. Specific examples thereof are a hole-injection layer, a hole-transport layer, a light-emitting layer, a hole-blocking layer, an electron-transport layer (a fourth layer), an electron-injection layer, and the like, and these layers can be combined as appropriate. Further, in the EL layer 103, a charge generation region (the fifth layer) can be provided in contact with the anode 101.

Specific examples of the materials for the layers included in the above EL layer 103 are described below.

The hole-injection layer is a layer containing a substance having a hole-injection property. As the substance having a hole-injection property, for example, molybdenum oxide, vanadium oxide, ruthenium oxide, tungsten oxide, or manganese oxide can be used. Alternatively, it is possible to use a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesulfonic acid) (PEDOT/PSS), or the like to form the hole-injection layer.

The hole-transport layer is a layer containing a substance having a hole-transport property. As the substance having a hole-transport property, the following can be given, for example: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. Any of the following carbazole derivatives can be used as well: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthryl)phenyl]-9H-carbazole (abbreviation: CzPA). The substances mentioned here are mainly substances that have a hole mobility of $10^{-6}$ $cm^2/Vs$ or more. As well as the above substances, any other substance that has a property of transporting more holes than electrons may be used. Further, the layer containing a high hole-transport property is not limited to a single layer, and may be a stack of two or more layers containing any of the above substances.

Alternatively, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used for the hole-transport layer.

The light-emitting layer is a layer containing a light-emitting substance. As the light-emitting substance, any of the following fluorescent compounds can be used. Examples thereof are: N,N'-bis[4-(9H-carbazol-9-yl)phenyl]-N,N'-diphenylstilbene-4,4'-diamine (abbreviation: YGA2S); 4-(9H-carbazol-9-yl)-4'-(10-phenyl-9-anthryl)triphenylamine (abbreviation: YGAPA); 4-(9H-carbazol-9-yl)-4'-(9,10-diphenyl-2-anthryl)triphenylamine (abbreviation: 2YGAPPA); N,9-diphenyl-N-[4-(10-phenyl-9-anthryl)phenyl]-9H-carbazol-3-amine (abbreviation: PCAPA); perylene; 2,5,8,11-tetra-tert-butylperylene (abbreviation: TBP); 4-(10-phenyl-9-anthryl)-4'-(9-phenyl-9H-carbazol-3-yl)triphenylamine (abbreviation: PCBAPA); N,N''-(2-tert-butylanthracene-9,10-diyldi-4,1-phenylene)bis[N,N',N'-triphenyl-1,4-phenylenediamine] (abbreviation: DPABPA); N,9-diphenyl-N-[4-(9,10-diphenyl-2-anthryl)phenyl]-9H-carbazol-3-amine (abbreviation: 2PCAPPA); N-[4-(9,10-diphenyl-2-anthryl)phenyl]-N,N',N'-triphenyl-1,4-phenylenediamine (abbreviation: 2DPAPPA); N,N,N',N',N'',N'',N''',N'''-octaphenyldibenzo[g,p]chrysene-2,7,10,15-tetraamine (abbreviation: DBC1); coumarin 30; N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N',N'-triphenyl-1,4-phenylenediamine (abbreviation: 2DPAPA); N-[9,10-bis(1,1'-biphenyl-2-yl)-2-anthryl]-N,N',N'-triphenyl-1,4-phenylenediamine (abbreviation: 2DPABPhA); N-[9,10-bis(1,1'-biphenyl-2-yl)]-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); coumarin 545T, N,N'-diphenylquinacridone (abbreviation: DPQd); rubrene; 5,12-bis(1,1'-biphenyl-4-yl)-6,11-diphenyltetracene (abbreviation: BPT); 2-(2-{2-[4-(dimethylamino)phenyl]ethenyl}-6-methyl-4H-pyran-4-ylidene)propanedinitrile (abbreviation: DCM1); 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2); N,N,N',N'-tetrakis(4-methylphenyl)tetracene-5,11-diamine (abbreviation: p-mPhTD); 7,14-diphenyl-N,N,N',N'-tetrakis(4-methylphenyl)acenaphtho[1,2-a]fluoranthene-3,10-diamine (abbreviation: p-mPhAFD); 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI); 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB); 2-(2,6-bis{2-[4-(dimethylamino)phenyl]ethenyl}-4H-pyran-4-ylidene)propanedinitrile (abbreviation: BisDCM); 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM); and the like.

As the light-emitting substance, any of the following phosphorescent compounds can also be used. Examples are: bis[2-(4',6'-difluorophenyl)pyridinato-N,$C^{2'}$]iridium(III)tetrakis(1-pyrazolyl)borate (abbreviation: FIr6); bis[2-(4',6'-difluorophenyl)pyridinato-N,$C^{2'}$]iridium(III) picolinate (abbreviation: FIrpic); bis[2-(3',5'-bistrifluoromethylphenyl)pyridinato-N,$C^{2'}$]iridium(III) picolinate (abbreviation: Ir(CF$_3$ppy)$_2$(pic)); bis[2-(4',6'-difluorophenyl)pyridinato-N,$C^{2'}$]iridium(III) acetylacetonate (abbreviation: FIracac); tris(2-phenylpyridinato)iridium(III) (abbreviation: Ir(ppy)$_3$); bis(2-phenylpyridinato)iridium(III) acetylacetonate (abbreviation: Ir(ppy)$_2$(acac)); bis(benzo[h]quinolinato)iridium(III) acetylacetonate (abbreviation: Ir(bzq)$_2$(acac)); bis(2,4-diphenyl-1,3-oxazolato-N,$C^{2'}$)iridium(III) acetylacetonate (abbreviation: Ir(dpo)$_2$(acac)); bis[2-(4'-perfluorophenylphenyl)pyridinato]iridium(III) acetylacetonate (abbreviation: Ir(p-PF-ph)$_2$(acac)); bis(2-phenylbenzothiazolato-N,$C^{2'}$)iridium(III) acetylacetonate (abbreviation: Ir(bt)$_2$(acac)); bis[2-(2'-benzo[4,5-α]thienyl)pyridinato-N,$C^{3'}$]iridium(III) acetylacetonate (abbreviation: Ir(btp)$_2$(acac)); bis(1-phenylisoquinolinato-N,$C^{2'}$)iridium(III) acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$(acac)); (acetylacetonato)bis(2,3,5-triphenylpyrazinato)iridium(III) (abbreviation: Ir(tppr)$_2$(acac)); 2,3,7,8,12,13,17,18-octaethyl-21H,23H-porphyrin platinum(II) (abbreviation: PtOEP); tris(acetylacetonato)(monophenanthroline)terbium(III) (abbreviation: Tb(acac)$_3$(Phen)); tris(1,3-diphenyl-1,3-propanedionato)(monophenanthroline)europium(III) (abbreviation: Eu(DBM)$_3$(Phen)); tris[1-(2-thenoyl)-3,3,3-trifluoroacetonato](monophenanthroline)europium(III) (abbreviation: Eu(TTA)$_3$(Phen)); and the like.

Any of these light-emitting substances is preferably dispersed in a host material. Examples of the host material are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB), and 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. It is also possible to use a substance having a high hole-transport property including a carbazole derivative such as 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthryl)phenyl]-9H-carbazole (abbreviation: CzPA) or a high molecular compound such as poly[N-(4-{N'-[4-(4-diphenylamino)phenyl]phenyl-N'-phenylamino}phenyl)methacrylamide] (abbreviation: PTPDMA) and poly[N,N'-bis(4-butylphenyl)-N,N'-bis(phenyl)benzidine] (abbreviation: Poly-TPD). Alternatively, any of the following substances having an electron-transport property can be used: metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq); a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$); 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl] benzene (abbreviation: OXD-7); 9-[4-(5-phenyl-1,3,4-oxadiazol-2-yl)phenyl]-9H-carbazole (abbreviation: CO11); 3-(4-biphenylyl)-4-phenyl-5-(4-tert-biphenylyl)-1,2,4-triazole (abbreviation: TAZ), bathophenanthroline (abbreviation: BPhen), and bathocuproine (abbreviation: BCP).

The electron-transport layer is a layer containing a substance having an electron-transport property. As the substance having an electron-transport property, any of the following substances can be used: metal complexes having a quinoline skeleton or a benzoquinoline skeleton, such as tris (8-quinolinolato)aluminum (abbreviation: Alq), tris(4-methyl-8-quinolinolato)aluminum (abbreviation: Almq$_3$), bis (10-hydroxybenzo[h]-quinolinato)beryllium (abbreviation: BeBq$_2$), and bis(2-methyl-8-quinolinolato)(4-phenylphenolato)aluminum (abbreviation: BAlq); metal complexes having an oxazole-based ligand or a thiazole-based ligand, such as bis[2-(2-hydroxyphenyl)benzoxazolato]zinc (abbreviation: Zn(BOX)$_2$) and bis[2-(2-hydroxyphenyl)benzothiazolato]zinc (abbreviation: Zn(BTZ)$_2$); 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 9-[4-(5-phenyl-1,3,4-oxadiazol-2-yl)phenyl]-9H-carbazole (abbreviation: CO11); 3-(4-biphenylyl)-4-phenyl-5-(4-tert-butylphenyl)-1,2,4-triazole (abbreviation: TAZ); bathophenanthroline (abbreviation: BPhen); bathocuproine (abbreviation: BCP); and the like. The substances described here are mainly materials having an electron mobility of $10^{-6}$ cm$^2$/Vs or more. As well as the above substances, any other substance that has a property of transporting more electrons than holes may be used. Further, the electron-transport layer is not limited to a single layer, and may be a stack of two or more layers containing any of the above substances are stacked.

Alternatively, a high molecular compound such as poly[(9, 9-dihexylfluorene-2,7-diyl)-co-(pyridine-3,5-diyl)] (abbreviation: PF-Py) or poly[(9,9-dioctylfluorene-2,7-diyl)-co-(2, 2'-bipyridine-6,6'-diyl)] (abbreviation: PF-BPy) can be used for the electron-transport layer.

The electron-injection layer is a layer containing a substance having an electron-injection property. As the substance having an electron-injection property, the following can be given: an alkali metal, an alkaline-earth metal, or a compound thereof such as lithium (Li), cesium (Cs), calcium (Ca), lithium fluoride (LiF), cesium fluoride (CsF), and calcium fluoride (CaF$_2$). Further, it is also possible to use a layer containing a substance having an electron-transport property in which an alkali metal, an alkaline-earth metal, or a compound thereof is added, for example, a layer in which magnesium (Mg) is added in Alq.

In the EL layer 103, the fifth layer can be provided as a charge generation region so as to be in contact with the anode 101, as described above. The charge generation region contains a substance having a hole-transport property and an acceptor substance with respect to the substance having a hole-transport property. The charge generation region is not limited to the structure in which the substance having a hole-transport property and the acceptor substance are contained in one film, and may be a stack of a layer containing the substance having a hole-transport property and a layer containing the acceptor substance where the layer containing the acceptor substance is in contact with the anode 101.

By forming the fifth layer, the anode 101 can be formed without consideration of the work function of a material for the anode 101. In other words, the material for the anode 101 is not limited to a material having a high work function, but may be a material having a low work function.

As examples of the acceptor substance used for the fifth layer, an oxide of a metal belonging to any of Group 4 to Group 8 in the periodic table can be given. Specifically, vanadium oxide, niobium oxide, tantalum oxide, chromium oxide, molybdenum oxide, tungsten oxide, manganese oxide, and rhenium oxide are preferable because their electron-acceptor properties are high. In particular, molybdenum oxide is preferable. Note that molybdenum oxide has a feature of a low hygroscopic property. Since moisture adversely affects an EL element, use of a material having a low hygroscopic property is preferable.

As examples of the substance having a hole-transport property for the fifth layer, a variety of organic compounds such as aromatic amine compounds, carbazole derivatives, aromatic hydrocarbons, and high molecular compounds (e.g., oligomers, dendrimers, and polymers) can be given. Specifically, a substance having a hole mobility of $10^{-6}$ cm$^2$/Vs or more is preferably used. As well as these substances, any other substance that has a property of transporting more holes than electrons may be used.

Such layers are stacked in appropriate combination, whereby the EL layer 103 can be formed. Further, as a formation method of the EL layer 103, any of a variety of methods (e.g., a dry process or a wet process) can be selected as appropriate depending on a material to be used. A vacuum evaporation method, an inkjet method, a spin coating method, or the like can be used. Different formation methods may be employed depending on a layer.

The light-emitting element described in this embodiment can be fabricated by combination of the above-described materials. Light emission from the above-described light-emitting substance can be obtained with this light-emitting element; a variety of emission colors can be obtained by changing the kind of the light-emitting substance. In addition, a plurality of light-emitting substances having different emission colors may be used as the light-emitting substances, whereby light emission having a broad spectrum or white light emission can be obtained. Note that in order to obtain white light emission, a stack of layers which emit light whose colors are complementary or the like can be employed. Specific examples of the complementary colors are a combination of color blue and color yellow, a combination of color blue-green and color red, and the like.

Further, the light-emitting element described in this embodiment can be formed over any of a variety of substrates. As the substrate, for example, a substrate made of glass, plastic, a metal plate, metal foil, or the like can be used. In the case where light emission of the light-emitting element is extracted from the substrate side, a substrate having a light-transmitting property is used. Note that as the substrate, a substrate other than the above may be used as long as it can serve as a support in the fabrication process of the light-emitting element.

Note also that the element structure of the light-emitting element described in this embodiment can be applied to a passive matrix light-emitting device in which both electrodes are formed in a grid pattern over one substrate. However, in the case where the light-emitting device is used for a lighting device, there is no need to form the electrodes in a grid pattern. The element structure can also be applied to an active matrix light-emitting device including a light-emitting element which is electrically connected to a thin film transistor (TFT) functioning as a switch or the like and the driving of which is controlled by the TFT or the like. Note that there is no particular limitation on the structure of the TFT. A staggered TFT or an inversely staggered TFT may be employed. In addition, a driver circuit formed with a TFT may be formed using an n-type TFT and a p-type TFT, or using either an n-type ITT or a p-type TFT. In addition, there is no particular limitation on the crystallinity of a semiconductor film used in the TFT: an amorphous semiconductor film may be used, or a crystalline semiconductor film may be used; a single crystalline semiconductor film may be used. The single crystalline semiconductor film can be formed by a Smart Cut (registered trademark) method or the like. An oxide semiconductor, for example, an oxide semiconductor containing indium, gallium, and zinc can also be used.

With the element structure described in this embodiment, the driving voltage of an EL element can be reduced. Since the second layer 105 is provided between the first layer 106 and the third layer 104, it is possible to prevent interaction between the first layer 106 and the third layer 104 and prevent formation of a pn junction and formation of a depletion layer, whereby an increase in the driving voltage of the EL element can be suppressed.

Embodiment 2

In Embodiment 2, an example of the light-emitting element described in Embodiment 1 will be described with reference to FIGS. 3A and 3B.

Figure 3A:
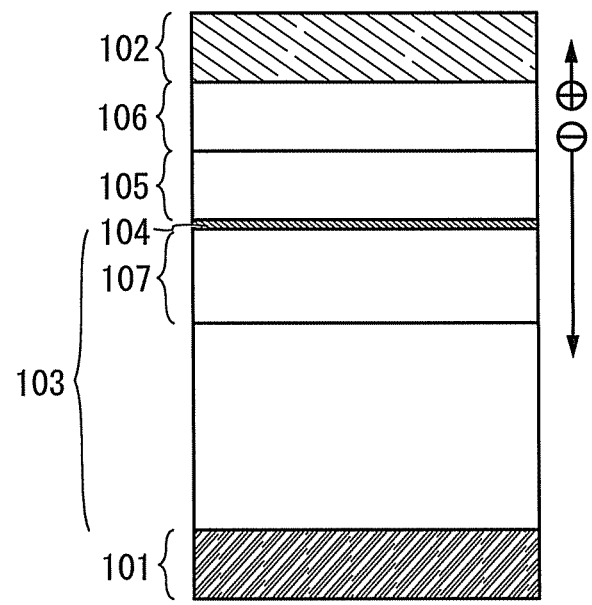
FIGS. 3A and 3B illustrate an element structure of a light-emitting element and a band diagram thereof.

In a light-emitting element shown in FIG. 3A, the EL layer 103 including a light-emitting region is provided between the pair of electrodes (the anode 101 and the cathode 102), and the first layer 106 which is a charge generation region, the second layer 105 which is an electron relay layer, and the third layer 104 which is an electron injection buffer are stacked in this order from the cathode 102 side between the cathode 102 and the EL layer 103.

The same materials described in Embodiment 1 can be used for the anode 101, the cathode 102, the EL layer 103, the first layer 106, and the second layer 105.

As a substance used for the third layer 104, the following substances having a high electron-injection property can be given as examples: alkali metals such as lithium (Li) and cesium (Cs); alkaline-earth metals such as magnesium (Mg), calcium (Ca), and strontium (Sr); rare-earth metals such as europium (Eu) and ytterbium (Yb); alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)).

After the EL layer 103 is formed over the anode 101, the third layer 104, the second layer 105, and the first layer 106 are sequentially formed thereover. The thickness of the third layer 104 is extremely small (specifically, greater than or equal to 0.1 nm and less than or equal to 1 nm) in order to avoid an increase in driving voltage. The third layer 104 is proximately located at the interface between the second layer 105 and the fourth layer 107 serving as an electron-transport layer included in the EL layer 103. However, if the third layer 104 is formed over the fourth layer 107 after formation of the fourth layer 107, part of a substance forming the third layer 104 can exist also in the fourth layer 107.

Figure 3B:
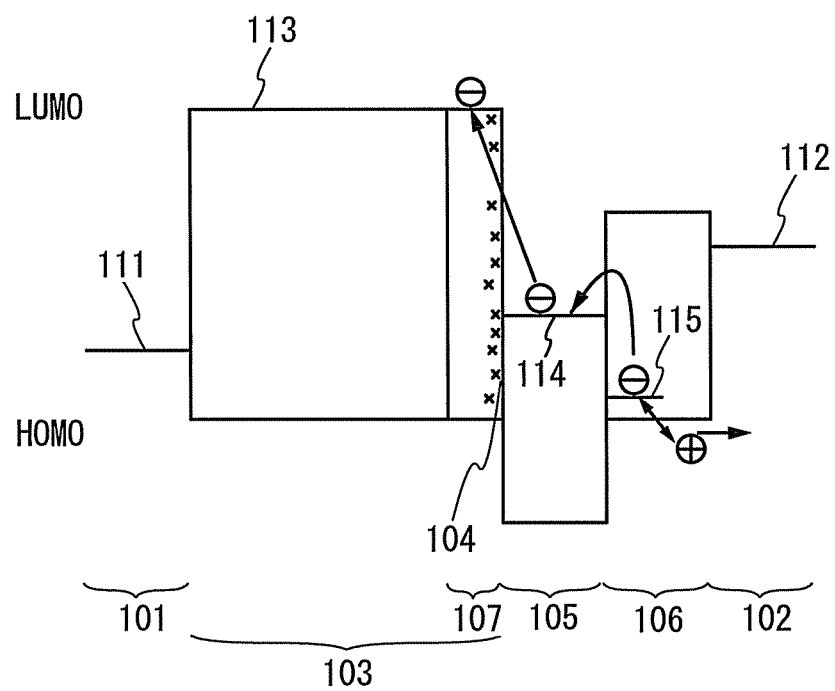

FIG. 3B is a band diagram in the case where the element illustrated in FIG. 3A is fabricated by sequentially stacking layers from the anode 101 side. The symbol x denotes a substance included in the third layer 104. Since the third layer 104 is very thin, the substance included in the third layer 104 can exist also in the fourth layer 107.

By providing the third layer 104 at the interface between the second layer 105 and the EL layer 103, an injection barrier can be reduced. Accordingly, electrons generated in the first layer 106 can be easily injected from the second layer 105 into the EL layer 103.

According to this embodiment where the third layer 104 is formed using the above substance to a thickness greater than or equal to 0.1 nm and less than or equal to 1 nm so as to be in contact with the fourth layer, the driving voltage of the light-emitting element can be more reduced than when the third layer 104 is formed with a substance having a high electron-transport property added as described in Embodiment 1.

Among the above-described substances having a high electron-injection property used for the third layer 104, the following ones are stable in the air and therefore suitable for mass production: alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)).

The structures described in Embodiment 1 can be combined as appropriate to be applied to the structure described in this embodiment.

For example, as described in Embodiment 1, a donor substance may be added in the second layer 105 so that the mass ratio of the donor substance to a phthalocyanine-based material is greater than or equal to 0.001:1 and less than or equal to 0.1:1. The donor substance described in Embodiment 1 can be used.

Embodiment 3

In Embodiment 3, an example of the light-emitting element described in Embodiment 1 will be described with reference to FIGS. 4A and 4B.

Figure 4A:
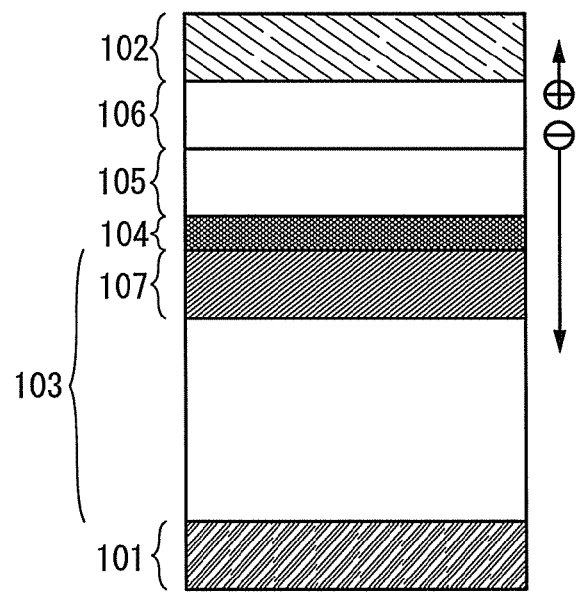
FIGS. 4A and 4B illustrate an element structure of a light-emitting element and a band diagram thereof.
Figure 4B:
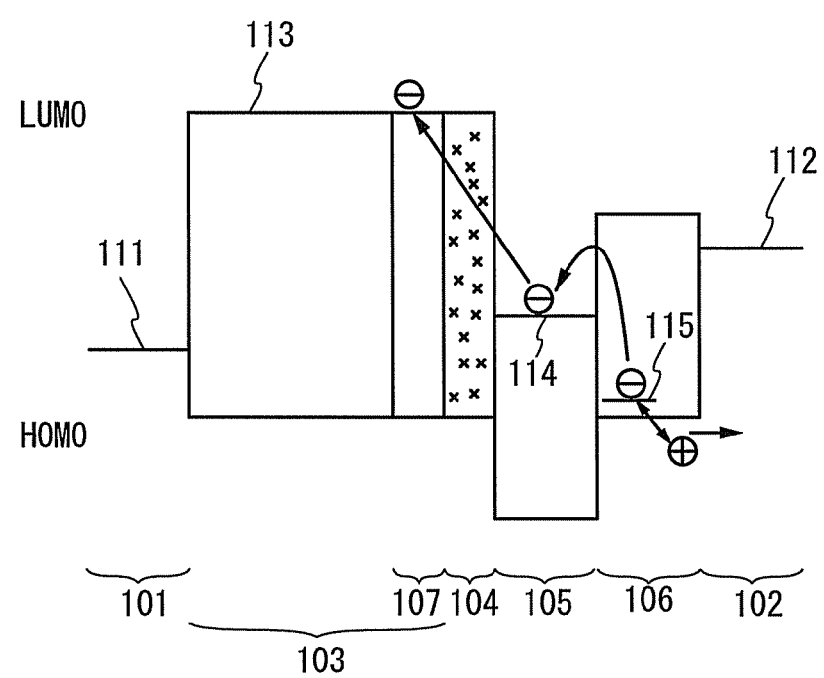

In a light-emitting element shown in FIG. 4A, the EL layer 103 including a light-emitting region is provided between the pair of electrodes (the anode 101 and the cathode 102), and the first layer 106 which serves as a charge generation region, the second layer 105 which serves as an electron relay layer, and the third layer 104 which serves as an electron injection buffer are stacked in this order from the cathode 102 side between the cathode 102 and the EL layer 103. The third layer 104 contains a substance having an electron-transport property and a donor substance.

In the third layer 104, a donor substance is preferably added so that the mass ratio thereof to the substance having an electron-transport property is greater than or equal to 0.001:1 and less than or equal to 0.1:1. Accordingly, the function as an electron-injection buffer is obtained.

The same materials described in Embodiment 1 can be used for the anode 101, the cathode 102, the EL layer 103, the first layer 106, and the second layer 105 in Embodiment 3.

As the substance having an electron-transport property used for the third layer 104, any of the following metal complexes having a quinoline skeleton or a benzoquinoline skeleton can be used: tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq), and the like. Any of the following metal complexes having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like, can be used as well. As well as the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances described here are mainly substances having an electron mobility of $10^{-6}$ cm$^2$/Vs or more.

A high molecular compound such as poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used as well.

As the donor substance used for the third layer 104, any of the following substances can be used: alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), rare-earth metal compounds (including oxides, halides, and carbonates)), and organic compounds such as tetrathianaphthacene (abbreviation: TTN), nickelocene, and decamethylnickelocene.

The substance having an electron-transport property used for the third layer 104 may be the same as or different from a substance having an electron-transport property used for the fourth layer 107 serving as an electron-transport layer included in the EL layer 103.

In the light-emitting element of Embodiment 3, the third layer 104 containing the substance having an electron-transport property and the donor substance is provided between the EL layer 103 and the second layer 105, as illustrated in FIG. 4A. FIG. 4B is a band diagram of this element structure. The symbol x denotes the donor substance.

By providing the third layer 104, an injection barrier between the second layer 105 and the EL layer 103 can be reduced. Accordingly, electrons generated in the first layer 106 can be easily injected from the second layer 105 into the EL layer 103.

The structures described in Embodiments 1 and 2 can be combined as appropriate to be applied to the structure described in this embodiment.

For example, as described in Embodiment 1, a donor substance may be added in the second layer 105 so that the mass ratio of the donor substance to a phthalocyanine-based material is greater than or equal to 0.001:1 and less than or equal to 0.1:1. The donor substance described in Embodiment 1 can be used.

Embodiment 4

In Embodiment 4, as for an example of the light-emitting element described in Embodiment 1, the structure of the first layer 106 will be described with reference to FIGS. 5A and 5B.

Figure 5A:
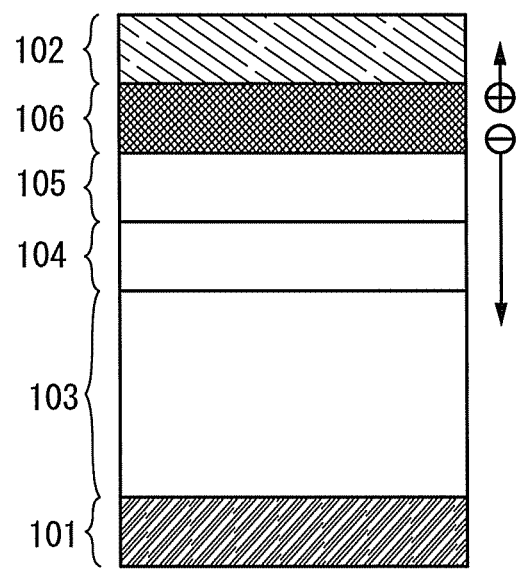
FIGS. 5A and 5B illustrate element structures of light-emitting elements.
Figure 5B:
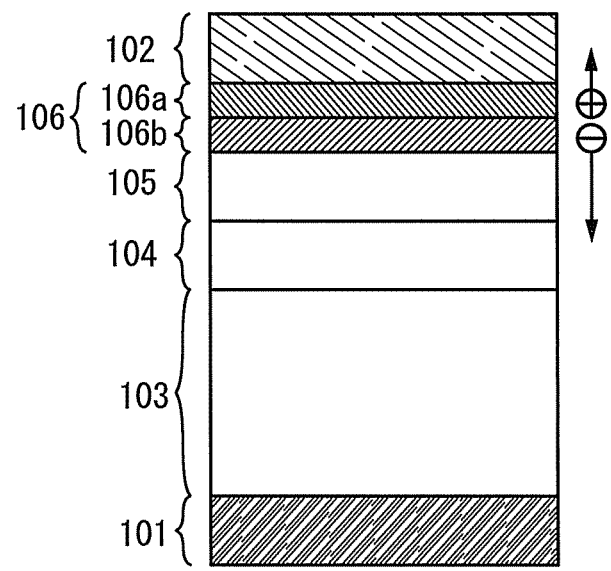

In examples of the light-emitting element shown in FIGS. 5A and 5B, the EL layer 103 including a light-emitting region is provided between the pair of electrodes (the anode 101 and the cathode 102), and the first layer 106, the second layer 105, and the third layer 104 are stacked in this order from the cathode 102 side between the cathode 102 and the EL layer 103. The same materials described in Embodiments 1 to 3 can be used for the anode 101, the cathode 102, the EL layer 103, the second layer 105, and the third layer 104.

The first layer 106 is a region that contains a substance having a hole-transport property and an acceptor substance. Thus, the acceptor substance draws electrons from the substance having a hole-transport property in the first layer 106, whereby holes and electrons are generated.

The first layer 106 illustrated in FIG. 5A has a structure in which the substance having a hole-transport property and the acceptor substance are contained in one film. In that case, it is preferable that the acceptor substance is added so that the mass ratio of the acceptor substance to the substance having a hole-transport property is greater than or equal to 0.1:1 and less than or equal to 4.0:1, so that carrier generation in the first layer 106 is facilitated.

On the other hand, the first layer 106 illustrated in FIG. 5B has a stack structure of a layer 106a containing the substance having a hole-transport property and a layer 106b containing the acceptor substance. A charge transfer complex produced in the first layer 106 exhibits a light absorption property in the visible region. In such a stack structure of the layer 106a containing the substance having a hole-transport property and the layer 106b containing the acceptor substance, the charge transfer complex is formed at the interface between the layer 106a and the layer 106b, not in the whole of the first layer 106; this is preferable in that the possibility of absorption of light emission from the EL layer 103 can be reduced.

The substance having a hole-transport property and the acceptor substance described in Embodiment 1 can be used for the first layer 106.

The structures described in Embodiments 1 to 3 can be combined as appropriate to be applied to the structure described in this embodiment.

For example, as described in Embodiment 1, a donor substance may be added in the second layer 105 so that the mass ratio of the donor substance to a phthalocyanine-based material is greater than or equal to 0.001:1 and less than or equal to 0.1:1. The donor substance described in Embodiment 1 can be used.

Embodiment 5

In Embodiment 5, as an example of the light-emitting element described in Embodiment 1, a structure in which a charge generation region is formed in the EL layer 103 to be in contact with the anode 101 will be described with reference to FIGS. 6A and 6B. Light-emitting elements illustrated in FIGS. 6A and 6B each include a fifth layer 108 which is a charge generation region provided in the EL layer 103 to be in contact with the anode 101, and a first layer 116 which is a charge generation region as described in Embodiment 1.

Figure 6A:
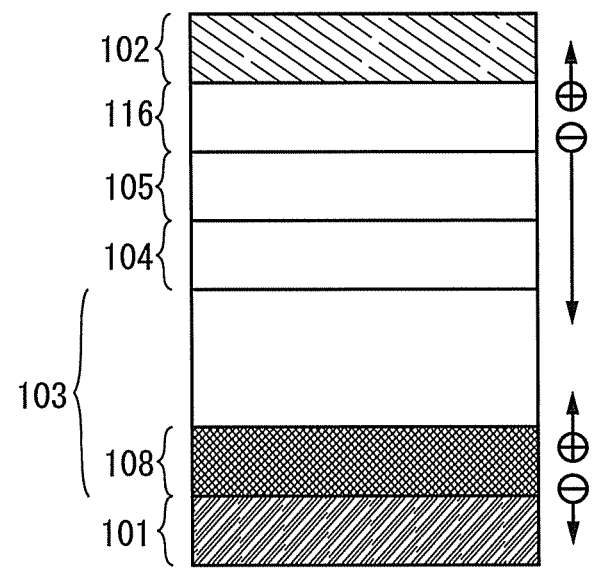
FIGS. 6A and 6B illustrate element structures of light-emitting elements.
Figure 6B:
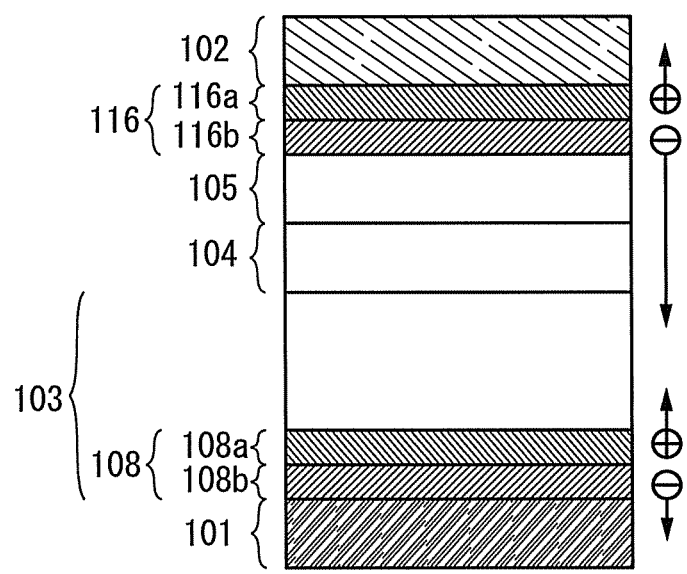

In examples of the light-emitting element shown in FIGS. 6A and 6B, the EL layer 103 including a light-emitting region is provided between the pair of electrodes (the anode 101 and the cathode 102), and the fifth layer 108 which is a charge generation region is provided in the EL layer 103 so as to be in contact with the anode 101. The first layer 116, the second layer 105, and the third layer 104 are stacked in this order from the cathode 102 side between the cathode 102 and the EL layer 103. The same materials described in Embodiments 1 to 4 can be used for the anode 101, the cathode 102, the EL layer 103, the third layer 104, the second layer 105, and the first layer 116.

In the light-emitting elements shown in FIGS. 6A and 6B, the fifth layer 108 is a region that contains a substance having a hole-transport property and an acceptor substance, like the first layer 116. Thus, the acceptor substance draws electrons from the substance having a hole-transport property in the fifth layer 108, whereby holes and electrons are generated. The holes are injected into the EL layer 103 and the electrons move to the anode 101.

The fifth layer 108 illustrated in FIG. 6A has a structure in which the substance having a hole-transport property and the acceptor substance are contained in one film. In that case, it is preferable that the acceptor substance is added so that the mass ratio of the acceptor substance to the substance having a hole-transport property is greater than or equal to 0.1:1 and less than or equal to 4.0:1, so that carrier generation in the fifth layer 108 is facilitated. The fifth layer 108 and the first layer 116 may be formed using the same material in FIG. 6A, which is preferable in that the stress applied to the anode 101 side of the light-emitting element and the stress applied to the cathode 102 side become uniform.

On the other hand, the fifth layer 108 illustrated in FIG. 6B has a stack structure of a layer 108a containing the substance having a hole-transport property and a layer 108b containing the acceptor substance. A charge transfer complex produced in the fifth layer 108 exhibits a light absorption property in the visible region. In such a stack structure of the layer 108a containing the substance having a hole-transport property and the layer 108b containing the acceptor substance, the charge transfer complex is formed at the interface between the layer 108a and the layer 108b, not in the whole of the fifth layer 108; this is preferable in that the possibility of absorption of light emission from the EL layer 103 can be reduced. In addition, as illustrated in FIG. 6B, the first layer 116 may also have a structure in which a layer 116a containing a substance having a high-transport property and a layer 116b containing an acceptor substance are stacked.

The substance having a hole-transport property used for the first layer 106 described in Embodiment 1 can be used as the substance having a hole-transport property used for the fifth layer 108. The acceptor substance used for the first layer 106 described in Embodiment 1 can be used as the acceptor substance used for the fifth layer 108.

The structures described in Embodiments 1 to 4 can be combined as appropriate to be applied to the structure described in this embodiment.

For example, as described in Embodiment 1, a donor substance may be added in the second layer 105 so that the mass ratio of the donor substance to a phthalocyanine-based material is greater than or equal to 0.001:1 and less than or equal to 0.1:1. The donor substance described in Embodiment 1 can be used.

Embodiment 6

In Embodiment 6, as examples of a light-emitting device which is manufactured with the use of the light-emitting element described in Embodiment 1, 2, 3, 4, or 5, a passive-matrix light-emitting device and an active-matrix light-emitting device will be described.

FIGS. 7A to 7D and FIG. 8 illustrate examples of a passive-matrix light-emitting device.

In a passive-matrix (also called simple-matrix) light-emitting device, a plurality of anodes arranged in stripes (in stripe form) is provided to be perpendicular to a plurality of cathodes arranged in stripes, and a light-emitting layer is provided therebetween at each intersection. Therefore, light emission is performed in a pixel at an intersection of a selected anode (to which a voltage is applied) and a selected cathode.

Figure 7A:
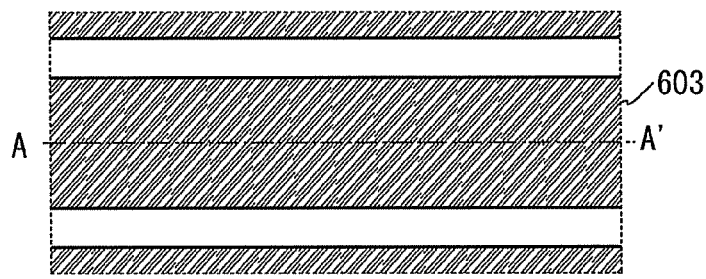
FIGS. 7A to 7D illustrate a passive-matrix light-emitting device.
Figure 7B:
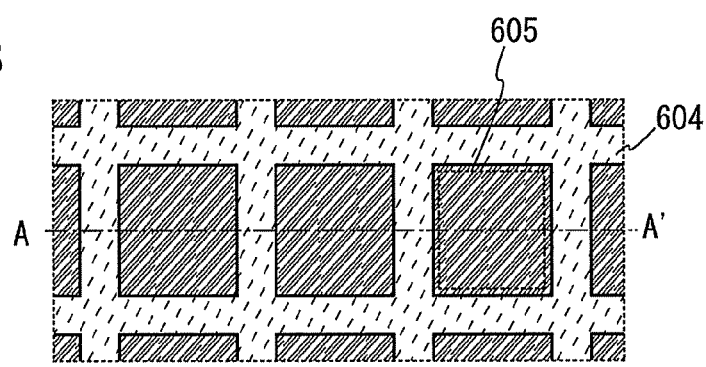
Figure 7C:
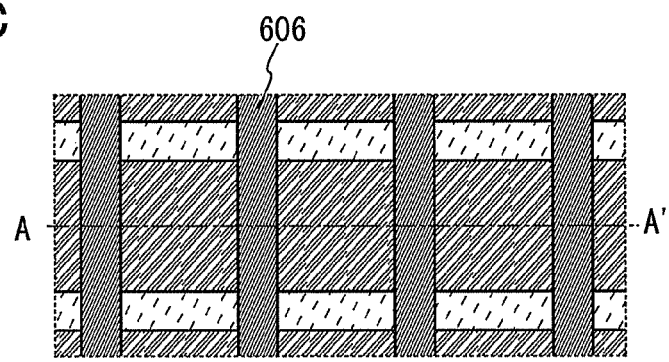
Figure 7D:
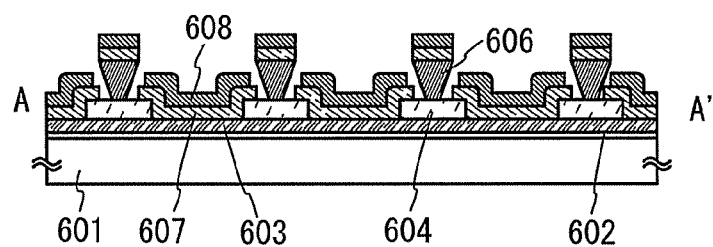

FIGS. 7A to 7C are top views of a pixel portion before sealing, and FIG. 7D is a cross-sectional view taken along dashed line A-A' in FIGS. 7A to 7C.

Over a substrate 601, an insulating layer 602 is formed as a base insulating layer. The base insulating layer is not necessarily provided if not necessary. Over the insulating layer 602, a plurality of first electrodes 603 are arranged in stripes with equal spacing between the stripes (FIG. 7A).

Further, a partition wall 604 having openings corresponding to pixels is provided over the first electrodes 603. The partition wall 604 having openings is formed using an insulating material (e.g., a photosensitive or nonphotosensitive organic material (e.g., polyimide, acrylic, polyamide, polyimide amide, resist, or benzocyclobutene) or a spin on glass (SOG) film (e.g., a $SiO_x$ film containing an alkyl group). An opening 605 corresponding to a pixel is a light-emitting region (FIG. 7B).

Over the partition wall 604 having openings, a plurality of inversely tapered partition walls 606 which are parallel to each other are provided to intersect with the first electrodes 603 (FIG. 7C). The inversely tapered partition walls 606 are formed by a photolithography method using a positive-type photosensitive resin by which a portion unexposed to light remains as a pattern, and the amount of light exposure or the length of development time is adjusted so that a lower portion of the pattern is etched more.

After formation of the inversely tapered partition walls 606 as shown in FIG. 7C, a layer containing an organic compound 607 and a second electrode 608 are sequentially formed as shown in FIG. 7D. The layer 607 containing an organic compound in this embodiment includes at least the EL layer, the first layer, the second layer, and the third layer described as the layers provided between the anode and the cathode in Embodiments 1 to 5. The sum of the heights of the partition wall 604 having openings and the inversely tapered partition wall 606 are set to exceed the sum of the thicknesses of the layer 607 containing an organic compound and the second electrode 608. Accordingly, as shown in FIG. 7D, the layers 607 containing an organic compound and the second electrodes 608 which are separated into a plurality of regions are formed. The plurality of regions is electrically isolated from one another.

The second electrodes 608 are parallel to each other in stripes and extend in the direction to intersect with the first electrodes 603. Note that the layer 607 containing an organic compound and part of the conductive layer of the second electrode 608 are also formed over the inversely tapered partition 606; however, they are divided from the layers 607 including an organic compound and the second electrodes 608 over the first electrodes 603.

Note that there is no particular limitation on whether either one of the first electrode 603 and the second electrode 608 is the anode or the cathode as long as one of the first electrode 603 and the second electrode 608 is the anode and the other is the cathode. The stack structure of the layer 607 containing an organic compound may be adjusted as appropriate depending on the polarities of the electrodes so as to realize the structure described in one of Embodiments 1 to 5.

In addition, a sealing member such as a sealing can or a glass substrate may be attached to the substrate 601 with adhesive such as a sealant so that the light-emitting element can be placed in a sealed space, if necessary. In this manner, deterioration of the light-emitting element can be prevented. The sealed space may be filled with filler or a dry inert gas. Further, a desiccant or the like may be put between the substrate and the sealing member to prevent deterioration of the light-emitting element due to moisture. The desiccant removes moisture even if the amount of moisture is minute, thereby achieving sufficient desiccation. As the desiccant, a substance which absorbs moisture by chemical adsorption such as an oxide of an alkaline earth metal as typified by calcium oxide or barium oxide can be used. Alternatively, a substance which adsorbs moisture by physical adsorption such as zeolite or silica gel may be used as the desiccant.

Figure 8:
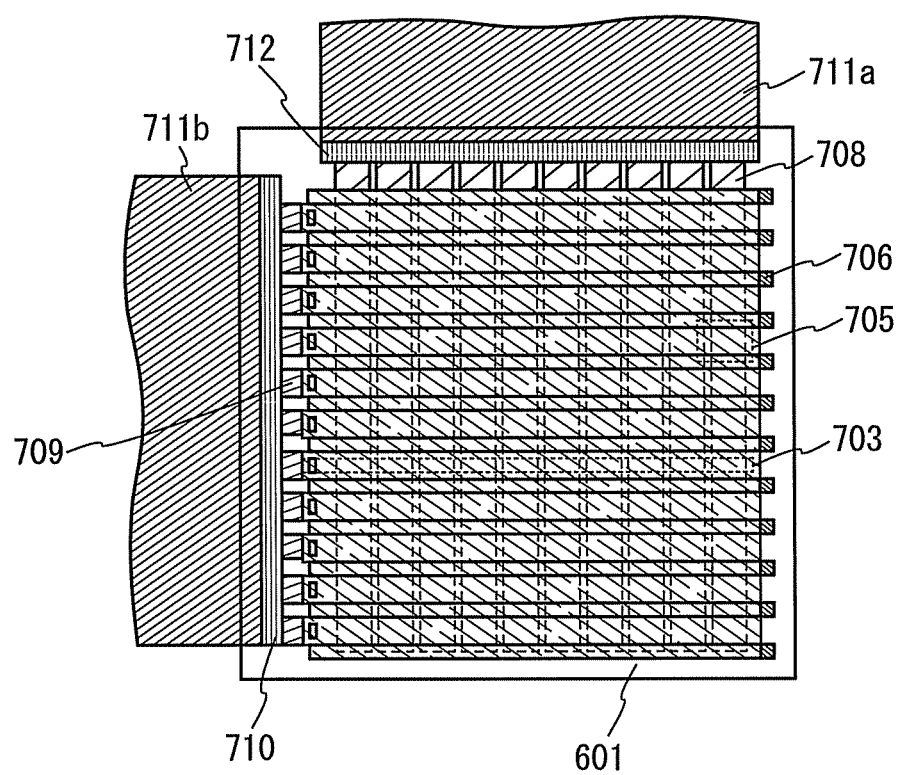
FIG. 8 illustrates a passive-matrix light-emitting device.

FIG. 8 is a top view of the passive-matrix light-emitting device shown in FIGS. 7A to 7D, which is equipped with an FPC and the like.

In a pixel portion on which an image is displayed in FIG. 8, scan lines and data lines intersect with each other so as to be perpendicular to each other.

The first electrode 603 in FIGS. 7A to 7D corresponds to a scan line 703 in FIG. 7, and the second electrode 608 in FIGS. 7A to 7D corresponds to a data line 708 in FIG. 8, and the inversely tapered partition wall 606 in FIGS. 7A to 7D corresponds to a partition wall 706 in FIG. 8. The layer 607 containing an organic compound in FIGS. 7A to 7D is provided between the data line 708 and the scan line 703, and an intersection indicated by a region 705 corresponds to one pixel.

Note that the scan lines 703 are electrically connected at their ends to connection wirings 709, and the connection wirings 709 are connected to an FPC 711b via an input terminal 710. In addition, the data lines 708 are connected to an FPC 711a via an input terminal 712.

If necessary, a polarizing plate, a circularly polarizing plate (including an elliptically polarizing plate), a retardation plate (a quarter-wave plate or a half-wave plate), or an optical film such as a color filter may be appropriately provided for an emission surface of light emitted from the light-emitting layer. Further, the polarizing plate or the circularly polarizing plate may be provided with an anti-reflection film. For example, anti-glare treatment by which reflected light can be diffused by surface roughness so as to reduce the glare can be performed.

Although FIG. 8 illustrates the example in which a driver circuit is not provided over the substrate, an IC chip including a driver circuit may be mounted on the substrate.

When the IC chip is mounted, a data-line-side IC and a scan-line-side IC, in each of which a driver circuit for transmitting a signal to a pixel portion is formed, may be mounted on the periphery of the pixel portion (outside the pixel portion) by a COG method. The mounting may be performed using a TCP or a wire bonding method other than the COG method. The TCP is a TAB tape mounted with the IC, and the TAB tape is connected to a wiring over an element formation substrate to mount the IC. Each of the data-line-side IC and the scan-line-side IC may be formed using a silicon substrate, or may be formed using a glass substrate, a quartz substrate, or a plastic substrate over which a driver circuit is formed using TFTs.

Figure 9A:
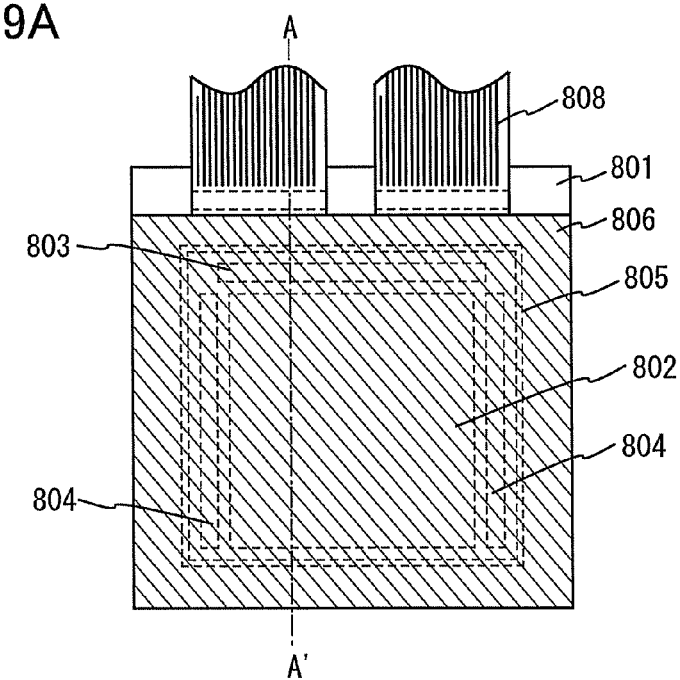
FIGS. 9A and 9B illustrate an active-matrix light-emitting device.
Figure 9B:
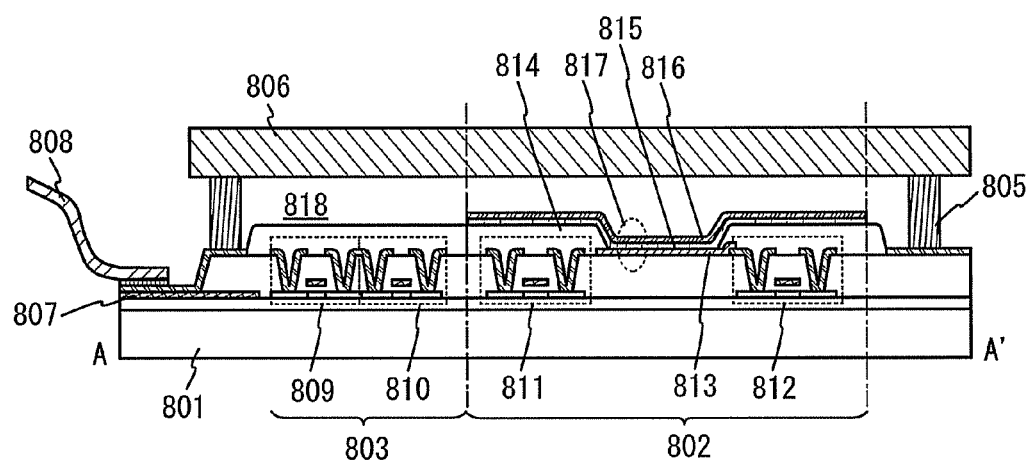

Next, an example of an active-matrix light-emitting device is described with reference to FIGS. 9A and 9B. FIG. 9A is a top view illustrating a light-emitting device and FIG. 9B is a cross-sectional view taken along dashed line A-A' in FIG. 9A. The active-matrix light-emitting device of this embodiment includes a pixel portion 802 provided over an element substrate 801, a driver circuit portion (a source driver circuit) 803, and a driver circuit portion (a gate driver circuit) 804. The pixel portion 802, the driver circuit portion 803, and the driver circuit portion 804 are sealed between the element substrate 801 and a sealing substrate 806 by a sealing member 805.

In addition, over the element substrate 801, a lead wiring 807 for connecting an external input terminal which transmits a signal (e.g., a video signal, a clock signal, a start signal, or a reset signal) or a potential to the driver circuit portion 803 and the driver circuit portion 804 is provided. Here, an example is described in which a flexible printed circuit (FPC) 808 is provided as the external input terminal. Although only the FPC is shown here, a printed wiring board (PWB) may be attached to the FPC. The light-emitting device in this specification includes, in its category, not only the light-emitting device itself but also the light-emitting device provided with the FPC or the PWB.

Next, a cross-sectional structure thereof is described with reference to FIG. 9B. Although the driver circuit portions and the pixel portion are formed over the element substrate 801, the pixel portion 802 and the driver circuit portion 803 which is the source driver circuit are shown here.

An example of the driver circuit portion 803 is shown in which a CMOS circuit which is a combination of an n-channel TFT 809 and a p-channel TFT 810 is formed. Note that a circuit included in the driver circuit portion may be formed using any of a variety of circuits such as a CMOS circuit, a PMOS circuit, or an NMOS circuit, as appropriate. Although a driver integrated type in which the driver circuit is formed over the substrate is described in this embodiment, the driver circuit is not necessarily formed over the substrate, and may be formed outside the substrate.

Further, the pixel portion 802 includes a plurality of pixels each including a switching TFT 811, a current-controlling TFT 812, and an anode 813 electrically connected to a wiring (a source electrode or a drain electrode) of the current-controlling TFT 812. An insulator 814 is formed so as to cover an end portion of the anode 813. In this embodiment, the insulator 814 is formed using a positive photosensitive acrylic resin.

The insulator 814 is preferably formed so as to have a curved surface with curvature at an upper end portion or a lower end portion thereof in order to provide favorable coverage by a film which is to be stacked over the insulator 814. For example, in the case of using a positive photosensitive acrylic resin as a material for the insulator 814, the insulator 814 is preferably formed so as to have a curved surface with a curvature radius (0.2 μm to 3 μm) at the upper end portion thereof. Either a negative photosensitive material which becomes insoluble in an etchant by light or a positive photosensitive material which becomes soluble in an etchant by light can be used for the insulator 814. As an example for the insulator 814, without limitation to an organic compound, an inorganic compound such as silicon oxide or silicon oxynitride can be used.

A layer 815 containing an organic compound and a cathode 816 are stacked over the anode 813. An ITO film may be used as the anode 813, and a stacked film of a titanium nitride film and a film containing aluminum as its main component or a stacked film of a titanium nitride film, a film containing aluminum as its main component, and a titanium nitride film may be used as the wiring of the current-controlling TFT 812 which is connected to the anode 813, whereby resistance of the wiring can be low and favorable ohmic contact with the ITO film can be obtained. Although not shown here, the cathode 816 is electrically connected to the FPC 808 which is an external input terminal.

The layer 815 containing an organic compound in this embodiment includes at least the EL layer, the first layer, the second layer, and the third layer described as the layers provided between the anode and the cathode in Embodiments 1 to 5. The EL layer includes at least a light-emitting layer, and may further include a hole-injection layer, a hole-transport layer, an electron-transport layer, and/or an electron-injection layer as appropriate. The stack structure of the anode 813, the layer 815 containing an organic compound, and the cathode 816 corresponds to a light-emitting element 817.

Although the cross-sectional view of FIG. 9B illustrates one light-emitting element 817, a plurality of light-emitting elements is arranged in matrix in the pixel portion 802. Therefore, in the case of color display with color elements of R (red), G (green), and B (blue), plural light-emitting elements for emission colors of three colors (R, G, B) are provided in the pixel portion 802. The number of color elements is not limited to three; four or more colors may be used or another color than RGB may be used as well. For example, a color element for white may be added to the three color elements so that a display with RGBW (W means white) can be performed.

As a method for forming light-emitting elements having different color elements, the following method can be used: a method in which an EL layer for each color is separately formed; a method in which all EL layers each for white emission are formed and color filters are used in combination with the EL layers, whereby light-emitting elements of different color components are obtained; a method in which all EL layers for blue emission or emission with a wavelength shorter than that of blue are formed and color conversion layers are used in combination with the EL layers, whereby light-emitting elements of different color components are obtained; or the like.

Furthermore, the sealing substrate 806 and the element substrate 801 are attached to each other with the sealing member 805, whereby the light-emitting element 817 is provided in a space 818 surrounded by the element substrate 801, the sealing substrate 806, and the sealing member 805. The space 818 may be filled with an inert gas (such as nitrogen or argon) or the sealing member 805.

It is preferable to use an epoxy resin for the sealing member 805. The material for the sealing member 805 is preferably a material which does not transmit moisture or oxygen as much as possible. As a material for the sealing substrate 806, a plastic substrate formed of FRP (fiberglass-reinforced plastics), PVF (polyvinyl fluoride), polyester, acrylic, or the like can be used as well as a glass substrate or a quartz substrate.

Through the above process, an active-matrix light-emitting device can be formed.

The structures described in Embodiments 1 to 5 can be combined as appropriate to be applied to the structure described in this embodiment.

Embodiment 7

In Embodiment 7, a variety of electronic devices and lighting devices which are manufactured using a light-emitting device according to one embodiment of the present invention will be described with reference to FIGS. 10A to 10E and FIG. 11.

Examples of such an electronic device for which a light-emitting device according to one embodiment of the present invention is used include: television sets (also called TV or television receivers); monitors for computers or the like; cameras such as digital cameras or digital video cameras; digital photo frames; mobile phones (also called cellular phones or portable telephones); portable game machines; portable information terminals; audio playback devices; and large game machines such as pachinko machines. Some specific examples of these electronic devices and lighting devices are illustrated in FIGS. 10A to 10E.

Figure 10A:
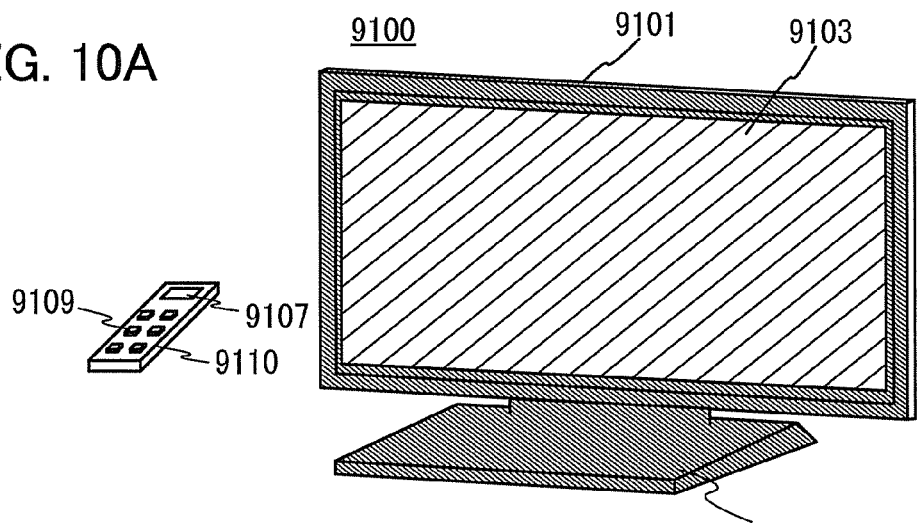
FIGS. 10A to 10E are views each illustrating an electronic device.

FIG. 10A illustrates an example of a television set. In a television set 9100, a display portion 9103 is incorporated in a housing 9101. Images can be displayed on the display portion 9103, and the light-emitting device according to one embodiment of the present invention can be used for the display portion 9103. The housing 9101 is supported by a stand 9105 in FIG. 10A.

The television set 9100 can be operated with an operation switch provided for the housing 9101 or a separate remote controller 9110. Channels and volume can be controlled with an operation key 9109 provided for the remote controller 9110 so that an image displayed on the display portion 9103 can be controlled. The remote controller 9110 may be provided with a display portion 9107 for displaying data output from the remote controller 9110.

The television set 9100 is provided with a receiver, a modem, and the like. The receiver enables reception of general TV broadcasting, and the television set 9100 may be connected to a communication network with or without wires via the modem, so that one-way (from sender to receiver) or two-way (between sender and receiver or between receivers) information communication can be performed.

Further, since the light-emitting device according to one embodiment of the present invention has lower power consumption, a long-life television set can be provided with the light-emitting device applied to the display portion 9103.

Figure 10B:
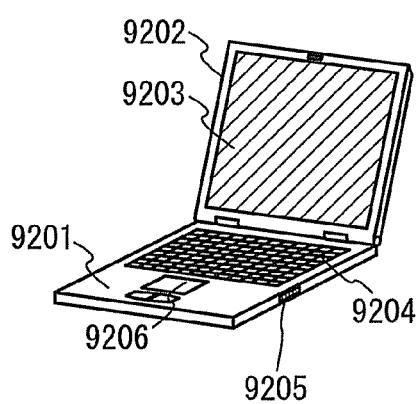

FIG. 10B illustrates a computer which includes a main body 9201, a housing 9202, a display portion 9203, a keyboard 9204, an external connection port 9205, a pointing device 9206, and the like. This computer is manufactured using the light-emitting device according to one embodiment of the present invention for the display portion 9203.

Further, since the light-emitting device according to one embodiment of the present invention has lower power consumption, a long-life computer can be provided with the light-emitting device applied to the display portion 9203.

Figure 10C:
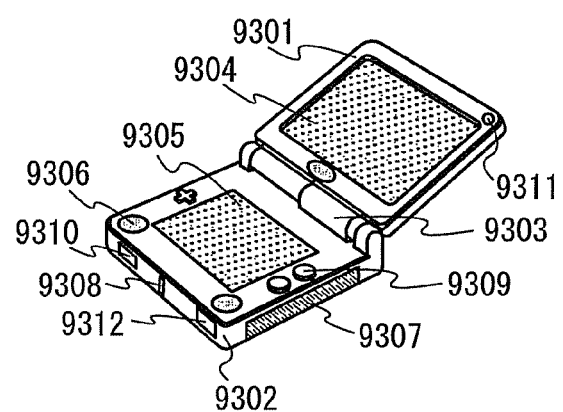

FIG. 10C illustrates a portable game machine including two housings, a housing 9301 and a housing 9302 which are jointed with a connector 9303 so as to be foldable. A display portion 9304 is incorporated in the housing 9301, and a display portion 9305 is incorporated in the housing 9302. In addition, the portable game machine shown in FIG. 10C includes a speaker portion 9306, a recording medium insertion portion 9307, an LED lamp 9308, an input means (an operation key 9309, a connection terminal 9310, a sensor 9311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9312), and the like. The structure of the portable game machine is not limited to the above and other structures in which the light-emitting device according to one embodiment of the present invention is used for at least one or both of the display portion 9304 and the display portion 9305 may be employed. The portable game machine may be equipped with other accessory equipment as appropriate. The portable game machine shown in FIG. 10C has a function of reading out a program or data stored in a storage medium to display on the display portion, and a function of sharing information with another portable game machine by wireless communication. The portable game machine shown in FIG. 10C can have a variety of functions without being limited to the above.

Further, since the light-emitting device according to one embodiment of the present invention has lower power consumption, a long-life portable game machine can be provided with the light-emitting device applied to the display portion(s) (9304, 9305).

Figure 10D:
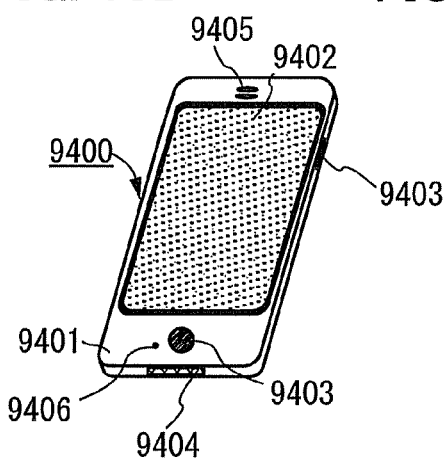

FIG. 10D illustrates an example of a mobile phone. A mobile phone 9400 is provided with a display portion 9402 incorporated in a housing 9401, operation buttons 9403, an external connection port 9404, a speaker 9405, a microphone 9406, and the like. The mobile phone 9400 is manufactured using the light-emitting device according to one embodiment of the present invention for the display portion 9402.

The display portion 9402 of the mobile phone 9400 shown in FIG. 10D may be touched with a finger or the like, so that data can be input into the mobile phone 9400. Users can make a call or text messaging by touching the display portion 9402 with their fingers or the like.

There are mainly three screen modes of the display portion 9402. The first mode is a display mode mainly for displaying images. The second mode is an input mode mainly for inputting data such as text. The third mode is a display-and-input mode in which two modes of the display mode and the input mode are combined.

For example, in making a call or text messaging, the display portion 9402 is set to a text input mode where text input is mainly performed, and text input operation can be done on a screen. In that case, it is preferable to display a keyboard or number buttons on almost the entire screen of the display portion 9402.

A detection device having a sensor for detecting inclination, such as a gyroscope or an acceleration sensor, may be provided inside the mobile phone 9400, so that display on the screen of the display portion 9402 can be automatically switched by determining the direction of the mobile phone 9400 (whether the mobile phone is placed horizontally or vertically, e.g., a landscape mode or a portrait mode).

The screen modes are changed by touching the display portion 9402 or using the operation buttons 9403 of the housing 9401. The screen modes can also be switched depending on the kind of image displayed on the display portion 9402. For example, when a signal of an image displayed on the display portion is a signal of moving image data, the screen mode is switched to the display mode; when the signal is a signal of text data, the screen mode is switched to the input mode.

Further, in the input mode, when input by touching the display portion 9402 is not performed for a certain period while a signal is detected by the optical sensor in the display portion 9402, the screen mode may be controlled so as to be switched from the input mode to the display mode.

The display portion 9402 can also function as an image sensor. For example, an image of a palm print, a fingerprint, or the like is taken with the display portion 1002 touched with the palm or the finger, whereby personal authentication can be performed. Further, by providing a backlight or a sensing light source which emits a near-infrared light for the display portion, an image of a finger vein, a palm vein, or the like can be taken.

Further, since the light-emitting device according to one embodiment of the present invention has lower power consumption, a long-life mobile phone can be provided with the light-emitting device applied to the display portion 9402 of the mobile phone 9400.

Figure 10E:
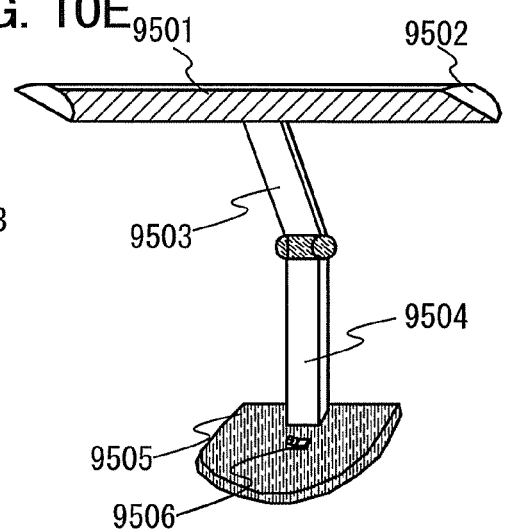

FIG. 10E illustrates a lighting device (a desk lamp) which includes a lighting portion 9501, a shade 9502, an adjustable arm 9503, a support 9504, a base 9505, and a power supply switch 9506. This lighting device is manufactured using the light-emitting device according to one embodiment of the present invention for the lighting portion 9501. The lighting device includes, in its category, ceiling lights (ceiling-fixed lighting devices), wall lights (wall-hanging lighting devices), and the like in addition to the desk lamp shown in FIG. 10E.

Further, since the light-emitting device according to one embodiment of the present invention has lower power consumption, a long-life lighting device (desk lamp) can be provided with the light-emitting device applied to the lighting portion 9501.

Figure 11:
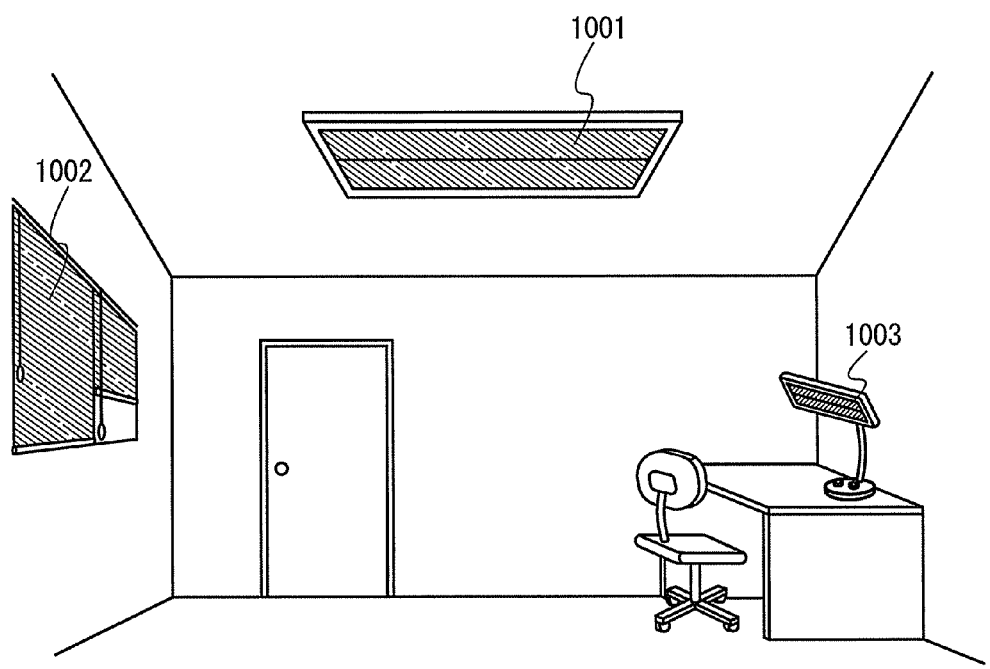
FIG. 11 is views illustrating lighting devices.

FIG. 11 illustrates an example in which the light-emitting device according to one embodiment of the present invention is used as a room lighting device. Since the light-emitting device of one embodiment of the present invention can also have a larger area, it can be used as a lighting device having a large area as shown by a ceiling light 1001. The light-emitting device can also be used as a wall light 1002. Since the light-emitting device according to one embodiment of the present invention includes a light-emitting element with low driving voltage, it can be used as the lighting device with low power consumption. As shown in FIG. 11, a desk lamp 1003, of which description is made in FIG. 10E, may be used together in the room provided with the room lighting device.

In the above-described manner, electronic devices or lighting devices can be obtained by application of the light-emitting device of one embodiment of the present invention. The applicable range of the light-emitting device of one embodiment of the present invention is so wide that the light-emitting device can be applied to electronic devices in a variety of fields.

The structures described in Embodiments 1 to 6 can be combined as appropriate to be applied to the structure described in this embodiment.

Example 1

In Example 1, a light-emitting element according to one embodiment of the present invention will be described. In this example, light-emitting elements A to F and a reference light-emitting element a were formed, and voltage versus luminance characteristics and voltage versus current density characteristics thereof were compared to one another. As a result, it was shown that the driving voltage of any of the light-emitting elements A to F is lower than that of the reference light-emitting element a, and it was found that a second layer in each of the light-emitting elements A to F exhibits a large effect.

For the second layer, CuPc, CoPc, FePc, ZnPc, SnPc, and $H_2Pc$ were used in the light-emitting elements A, B, C, D, E, and F, respectively. The second layer was not provided in the reference light-emitting element a.

In each of the light-emitting elements A to F and the reference light-emitting element a, indium tin oxide containing silicon oxide, aluminum, a combination of NPB and molybdenum oxide, and lithium oxide ($Li_2O$) were used for an anode, a cathode, a first layer, and a third layer, respectively. In each EL layer, a combination of NPB and molybdenum oxide, NPB, a combination of CzPA and 2PCAPA, and a combination of Alq and BPhen were used for a fifth layer, a hole-transport layer, a light-emitting layer, and a fourth layer, respectively. Structural formulae of the materials used in this example are illustrated below.

(Chemical Formula 5)

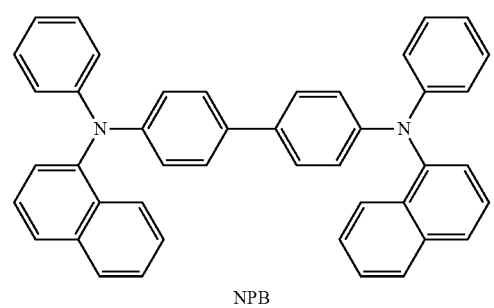

NPB

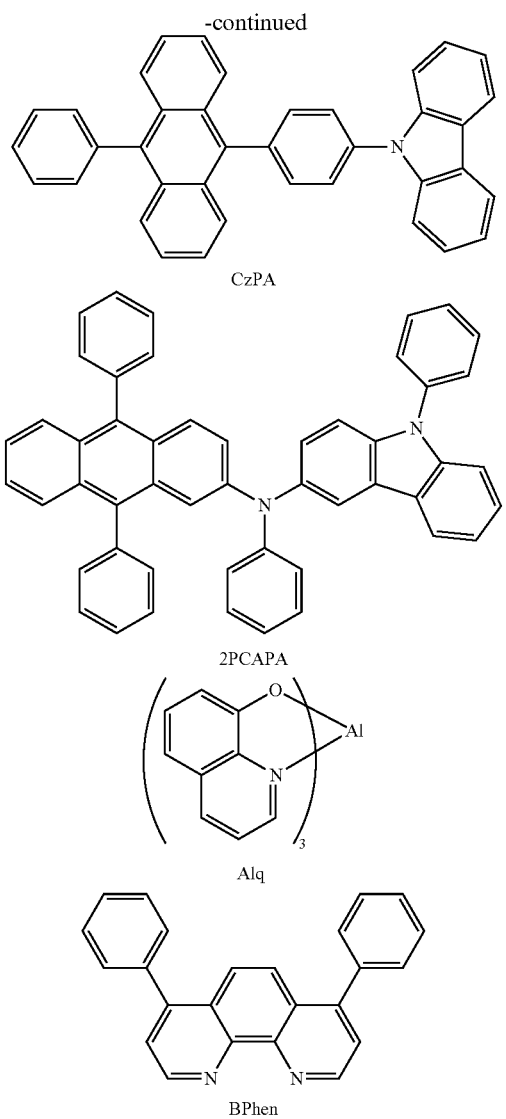

(Formation of Light-Emitting Elements A to F and Reference Light-Emitting Element a)

First, indium tin oxide containing silicon or silicon oxide was deposited to a thickness of 110 nm over a glass substrate by a sputtering method to form the anode (electrode area: 2 mm×2 mm).

Next, the glass substrate provided with the anode was fixed to a substrate holder provided in a deposition chamber in a vacuum evaporation apparatus such that the side on which the anode was formed faced downward. The vacuum evaporation apparatus was evacuated to about $10^{-4}$ Pa, and then, co-evaporation of 4,4'-bis[N-(1-naphthyl)-N-phenylamino]biphenyl (abbreviation: NPB) which is a substance having a high hole-transport property and molybdenum(VI) oxide which is an acceptor substance was performed, so that the fifth layer was formed. The thickness of the fifth layer was 50 nm, and the mass ratio of NPB to molybdenum(VI) oxide was adjusted to 4:1 (NPB:molybdenum oxide). Note that according to the co-evaporation, evaporation is carried out with the use of a plurality of evaporation sources at the same time in one process chamber.

Next, NPB was deposited to a thickness of 10 nm by an evaporation method using resistance heating to form the hole-transport layer.

Next, 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) were co-evaporated with the mass ratio of CzPA:2PCAPA=1:0.05 to form the light-emitting layer. The substance CzPA is a substance having an electron-transport property and 2PCAPA is a substance which exhibits green light emission. The thickness of the light-emitting layer was 30 nm.

Next, by an evaporation method using resistance heating, tris(8-quinolinolato)aluminum (abbreviation: Alq) was deposited to a thickness of 10 nm and then bathophenanthroline (abbreviation: BPhen) was deposited to a thickness of 10 nm to form the fourth layer.

Next, lithium oxide ($Li_2O$) was deposited to a thickness of about 0.1 nm to form the third layer by an evaporation method using resistance heating.

Next, any of CuPc, CoPc, FePc, ZnPc, SnPc, and $H_2Pc$ was deposited to a thickness of about 3 nm to form the second layer by an evaporation method using resistance heating. The substances CuPc, CoPc, FePc, ZnPc, SnPc, and $H_2Pc$ were deposited in the light-emitting elements A, B, C, D, E, and F, respectively. The second layer was not provided in the reference light-emitting element a.

Next, 4,4'-bis[N-(1-naphthyl)-N-phenylamino]biphenyl (abbreviation: NPB) which is a substance having a high hole-transport property and molybdenum(VI) oxide which is an acceptor substance were co-evaporated to form the first layer. The thickness of the first layer was 20 nm, and the mass ratio of NPB to molybdenum(VI) oxide was adjusted to 4:1 (NPB:molybdenum oxide).

Next, aluminum was deposited to a thickness of 200 nm to form the cathode. In this manner, the light-emitting elements A to F and the reference light-emitting element a were formed.

Table 1 shows part of element structures of the light-emitting elements A to F and the reference light-emitting element a. The light-emitting elements A to F correspond to the light-emitting elements described in Embodiment(s) 1, 2, 4, and/or 5. The structures of the anode, the fifth layer, the hole-transport layer, the light-emitting layer, and the fourth layer are the same throughout the light-emitting elements A to F and the reference light-emitting element a, and thus description thereof is omitted in Table 1.

TABLE 1

| | Anode | * | The third layer | The second layer | The first layer | Cathode |
|---|---|---|---|---|---|---|
| Light-Emitting Element A | NITO (110 nm) | ** | $Li_2O$ (0.1 nm) | CuPc (3 nm) | NPB:$MoO_x$ (4:1, 20 nm) | Al (200 nm) |
| Light-Emitting Element B | | | | CoPc (3 nm) | | |
| Light-Emitting Element C | | | | FePc (3 nm) | | |

TABLE 1-continued

|  | Anode | * | The third layer | The second layer | The first layer | Cathode |
|---|---|---|---|---|---|---|
| Light-Emitting Element D |  |  |  | ZnPc (3 nm) |  |  |
| Light-Emitting Element E |  |  |  | SnPc (3 nm) |  |  |
| Light-Emitting Element F |  |  |  | H$_2$Pc (3 nm) |  |  |
| Reference Light-Emitting Element a |  |  |  | — |  |  |

* The fifth layer, the hole-transport layer, the light-emitting layer, and the fourth layer are omitted.
**The materials and thicknesses of the layers are omitted.

The light-emitting elements A to F and the reference light-emitting element a thus obtained were put into a glove box under a nitrogen atmosphere and the light-emitting elements were sealed from atmospheric air. Then, the operation characteristics of the light-emitting elements were measured at room temperature (under an atmosphere kept at 25° C.). Green emission at a wavelength of around 520 nm from 2PCAPA which is the light-emitting substance was obtained from each light-emitting element.

Figure 12:
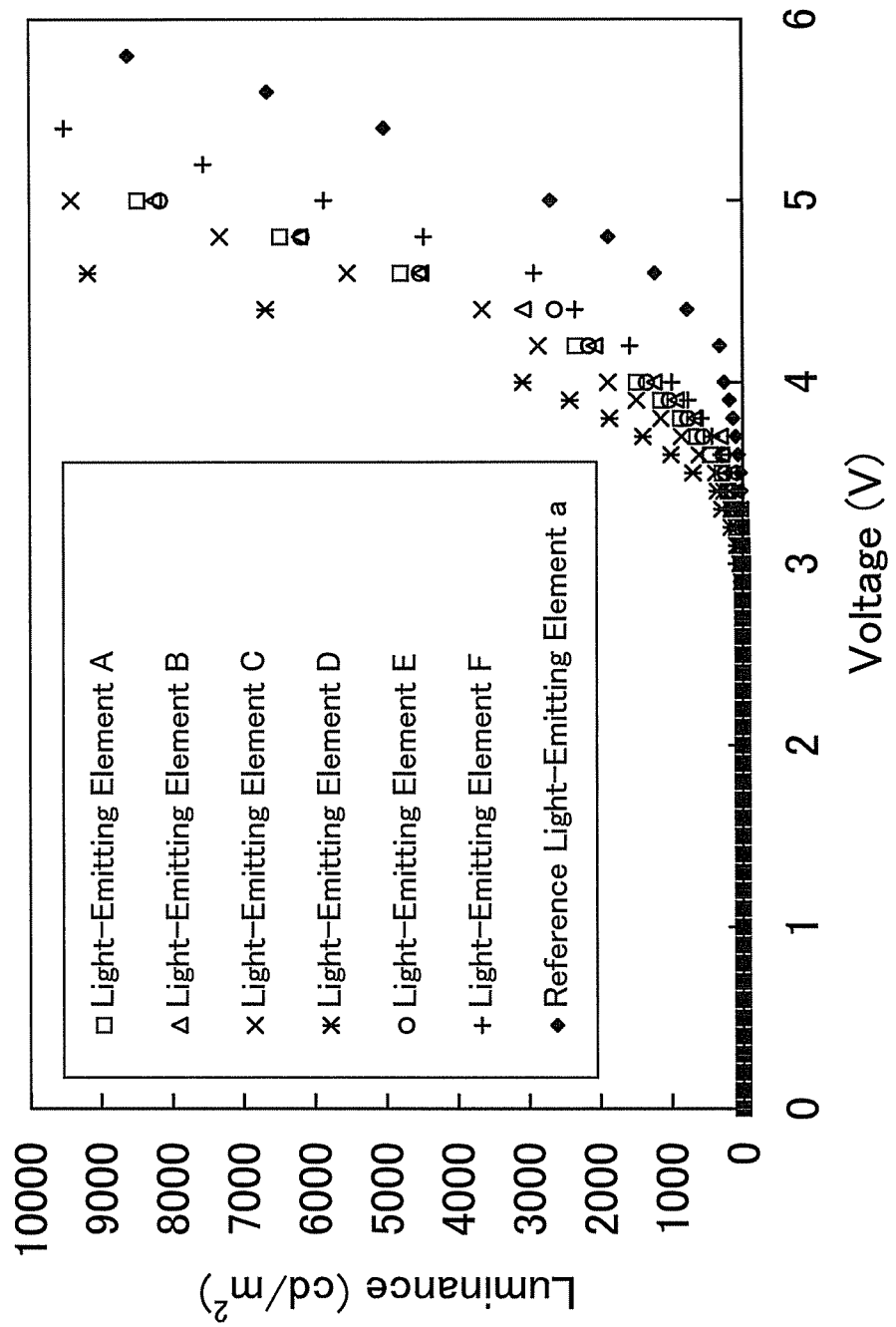
FIG. 12 is a graph showing characteristics of light-emitting elements of Example 1.
Figure 13:
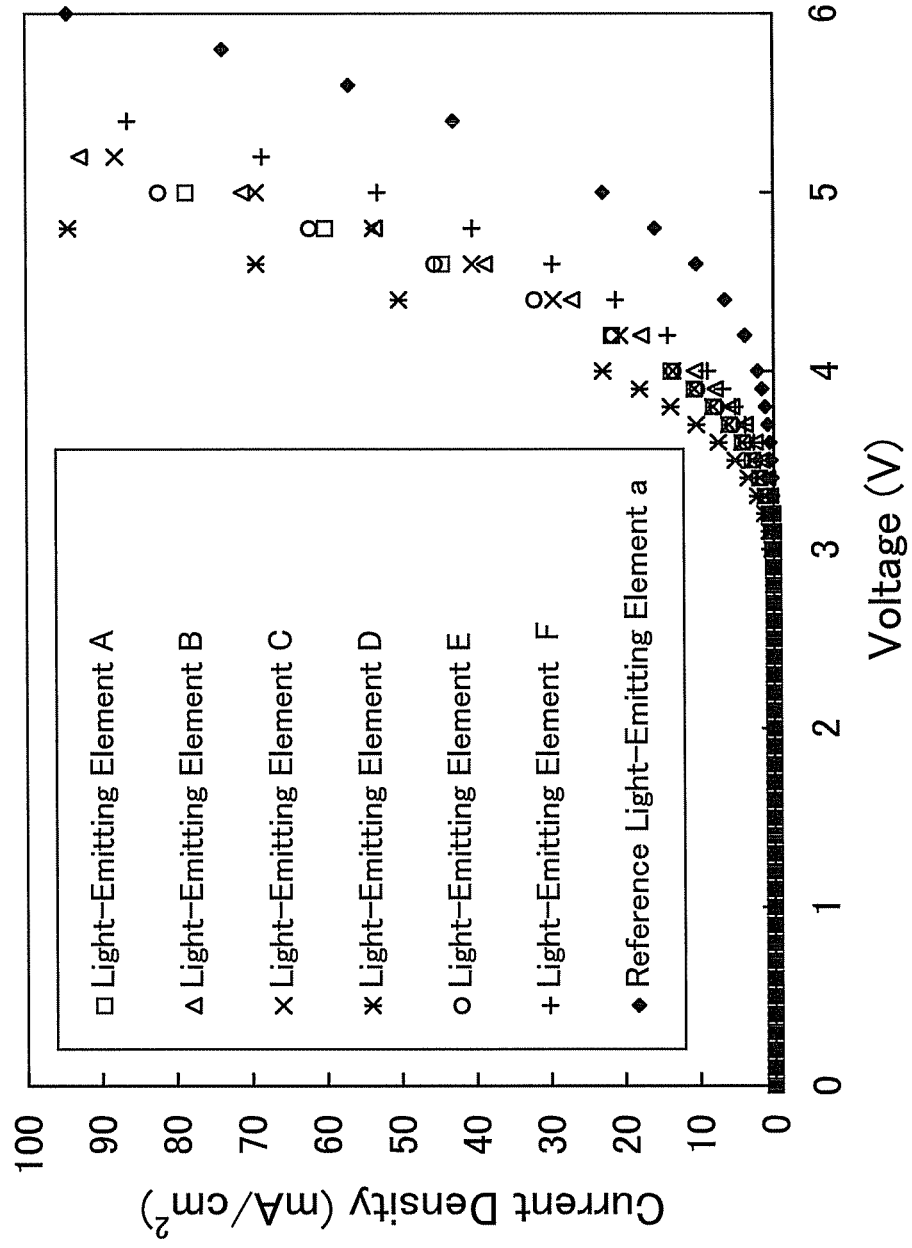
FIG. 13 is a graph showing characteristics of light-emitting elements of Example 1.

FIG. 12 and FIG. 13 respectively show voltage versus luminance characteristics and voltage versus current density characteristics of the light-emitting elements A to F and the reference light-emitting element a. Table 2 lists main initial characteristics of each light-emitting element at around 1000 cd/m$^2$.

TABLE 2

|  | Voltage (V) | Chromaticity (x, y) | Current Efficiency (cd/A) | External Quantum Efficiency (%) |
|---|---|---|---|---|
| Light-Emitting Element A | 3.9 | (0.29, 0.61) | 11 | 3.2 |
| Light-Emitting Element B | 3.9 | (0.30, 0.61) | 12 | 3.5 |
| Light-Emitting Element C | 3.8 | (0.30, 0.61) | 14 | 4.1 |
| Light-Emitting Element D | 3.6 | (0.28, 0.61) | 14 | 4.0 |
| Light-Emitting Element E | 3.9 | (0.28, 0.59) | 10 | 3.1 |
| Light-Emitting Element F | 4.0 | (0.29, 0.60) | 11 | 3.4 |
| Reference Light-Emitting Element a | 4.5 | (0.30, 0.60) | 12 | 3.6 |

It can be seen from FIG. 12 that a higher luminance can be obtained at the same voltage by any of the light-emitting elements A to F with the second layer as compared to the reference light-emitting element a.

Also in the voltage versus current density characteristics shown in FIG. 13, a higher current density can be obtained at the same voltage by any of the light-emitting elements A to F as compared to the reference light-emitting element a.

Referring to Table 2 at around 1000 cd/m$^2$, the respective driving voltages of the light-emitting elements A to F (A: 3.9 V; B: 3.9 V; C, 3.8 V; D: 3.6 V; E: 3.9 V; F: 4.0 V) are lower than that of the reference light-emitting element (4.5 V). As for the chromaticity, current efficiency, and external quantum efficiency, the light-emitting elements A to F are equivalent or almost equivalent to the reference light-emitting element a.

The above-described results reveal that an increase of the driving voltage of the light-emitting element can be suppressed by the second layer.

Example 2

In Example 2, a light-emitting element according to one embodiment of the present invention will be described. In this example, a light-emitting element G and a reference light-emitting element b were formed, and voltage versus luminance characteristics and voltage versus current density characteristics thereof were compared to each other. As a result, it was shown that the driving voltage of the light-emitting element G is lower than that of the reference light-emitting element b, and it was found that a second layer in the light-emitting element G exhibits a large effect.

A substance CuPc was used for the second layer in the light-emitting element G, whereas the second layer was not provided in the reference light-emitting element b.

In each of the light-emitting element G and the reference light-emitting element b, indium tin oxide containing silicon oxide, aluminum, a combination of NPB and molybdenum oxide, and a combination of BPhen and Ca were used for an anode, a cathode, a first layer, and a third layer, respectively. In each EL layer, a combination of NPB and molybdenum oxide, NPB, a combination of CzPA and 2PCAPA, and BPhen were used for a fifth layer, a hole-transport layer, a light-emitting layer, and a fourth layer, respectively. Structural formulae of the materials used in this example are illustrated in Example 1 and thus omitted here.

(Formation of Light-Emitting Element G and Reference Light-Emitting Element b)

First, indium tin oxide containing silicon or silicon oxide was deposited to a thickness of 110 nm over a glass substrate by a sputtering method to form the anode (electrode area: 2 mm×2 mm).

Next, the glass substrate provided with the anode was fixed to a substrate holder provided in a deposition chamber in a vacuum evaporation apparatus such that the side on which the anode was formed faced downward. The vacuum evaporation apparatus was evacuated to about 10$^{-4}$ Pa, and then, co-evaporation of 4,4'-bis[N-(1-naphthyl)-N-phenylamino]biphenyl (abbreviation: NPB) which is a substance having a high hole-transport property and molybdenum(VI) oxide which is an acceptor substance was performed, so that the fifth layer was formed. The thickness of the firth layer was 50 nm, and the mass ratio of NPB to molybdenum(VI) oxide was adjusted to 4:1 (NPB:molybdenum oxide). Note that according to the co-evaporation, evaporation is carried out with the use of a plurality of evaporation sources at the same time in one process chamber.

Next, NPB was deposited to a thickness of 10 nm by an evaporation method using resistance heating to form the hole-transport layer.

Next, 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) were co-evaporated with the mass ratio of CzPA:2PCAPA=1: 0.05 to form the light-emitting layer. The substance CzPA is a substance having an electron-transport property and 2PCAPA is a substance which exhibits green light emission. The thickness of the light-emitting layer was 30 nm.

Next, by an evaporation method using resistance heating, bathophenanthroline (abbreviation: BPhen) was deposited to a thickness of 10 nm to form the fourth layer.

Next, Bphen and Ca were co-deposited to form the third layer. The thickness of the third layer was 10 nm and the mass ratio of Bphen to Ca was adjusted to 1:0.1 (Bphen:Ca).

Next, CuPc was deposited to a thickness of about 2 nm to form the second layer by an evaporation method using resistance heating. The substance CuPc was deposited in the light-emitting element G. The second layer was not provided in the reference light-emitting element b.

Next, 4,4'-bis[N-(1-naphthyl)-N-phenylamino]biphenyl (abbreviation: NPB) which is a substance having a high hole-transport property and molybdenum(VI) oxide which is an acceptor substance were co-evaporated to form the first layer. The thickness of the first layer was 20 nm, and the mass ratio of NPB to molybdenum(VI) oxide was adjusted to 4:1 (NPB: molybdenum oxide).

Next, aluminum was deposited to a thickness of 200 nm to form the cathode. In this manner, the light-emitting element G and the reference light-emitting element b were formed.

Table 3 shows part of element structures of the light-emitting element G and the reference light-emitting element b. The light-emitting element G corresponds to the light-emitting element described in Embodiment 1, 2, 4, or 5. The structures of the anode, the fifth layer, the hole-transport layer, the light-emitting layer, and the fourth layer are the same throughout the light-emitting element G and the reference light-emitting element b, and thus description thereof is omitted in Table 3.

TABLE 3

| | Anode | * | The third layer | The second layer | The first layer | Cathode |
|---|---|---|---|---|---|---|
| Light-Emitting Element G | NITO (110 nm) | ** | BPhen:Ca (1:0.1, 10 nm) | CuPc (2 nm) | NPB:MoO$_x$ (4:1, 20 nm) | Al (200 nm) |
| Reference Light-Emitting Element b | | | | — | | |

* The fifth layer, the hole-transport layer, the light emitting layer, and the fourth layer are omitted.
**The materials and thicknesses of the layers are omitted.

The light-emitting element G and the reference light-emitting element b thus obtained were put into a glove box under a nitrogen atmosphere and the light-emitting elements were sealed from atmospheric air. Then, the operation characteristics of the light-emitting elements were measured at room temperature (under an atmosphere kept at 25° C.). Green emission at a wavelength of around 520 nm from 2PCAPA which is the light-emitting substance was obtained from either light-emitting element.

Figure 14:
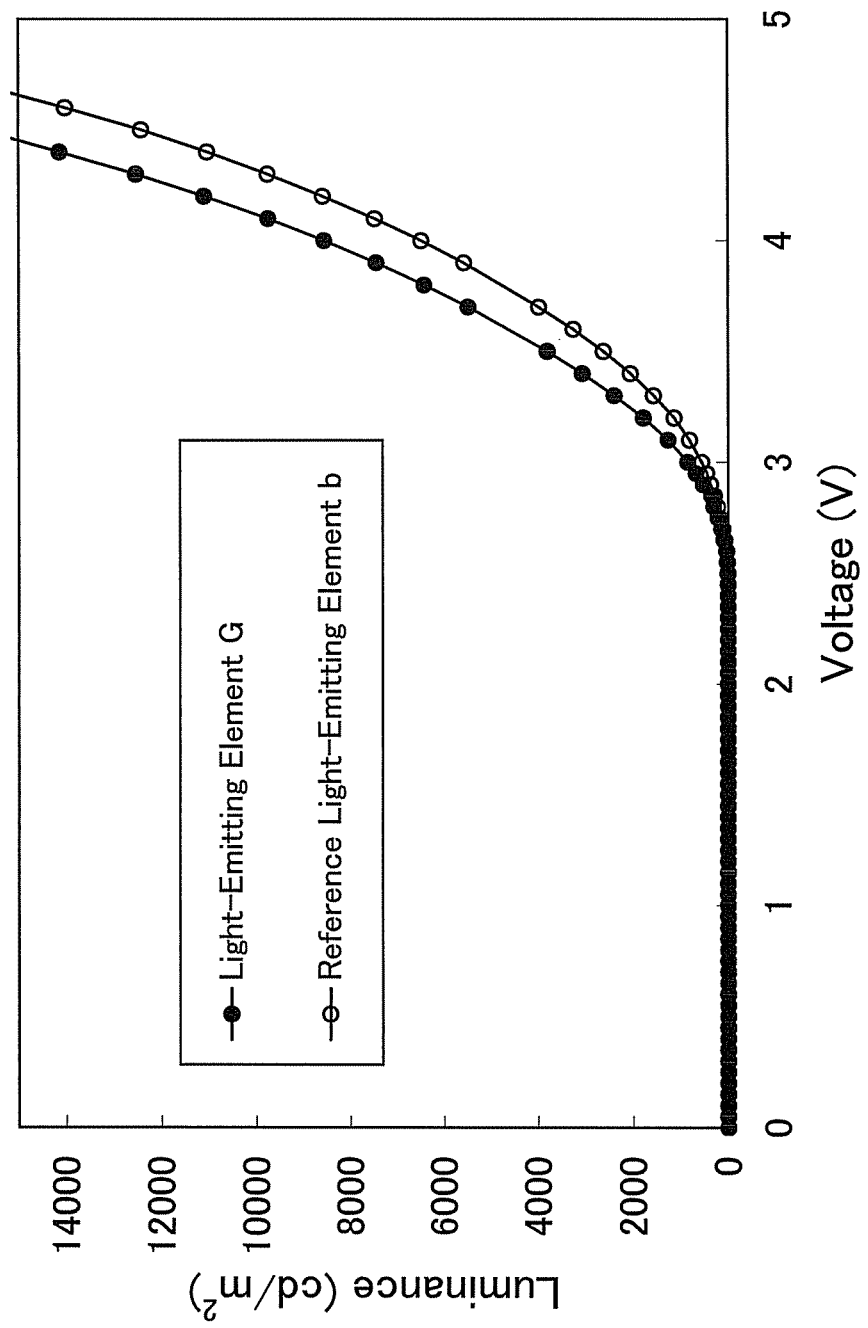
FIG. 14 is a graph showing characteristics of light-emitting elements of Example 2.
Figure 15:
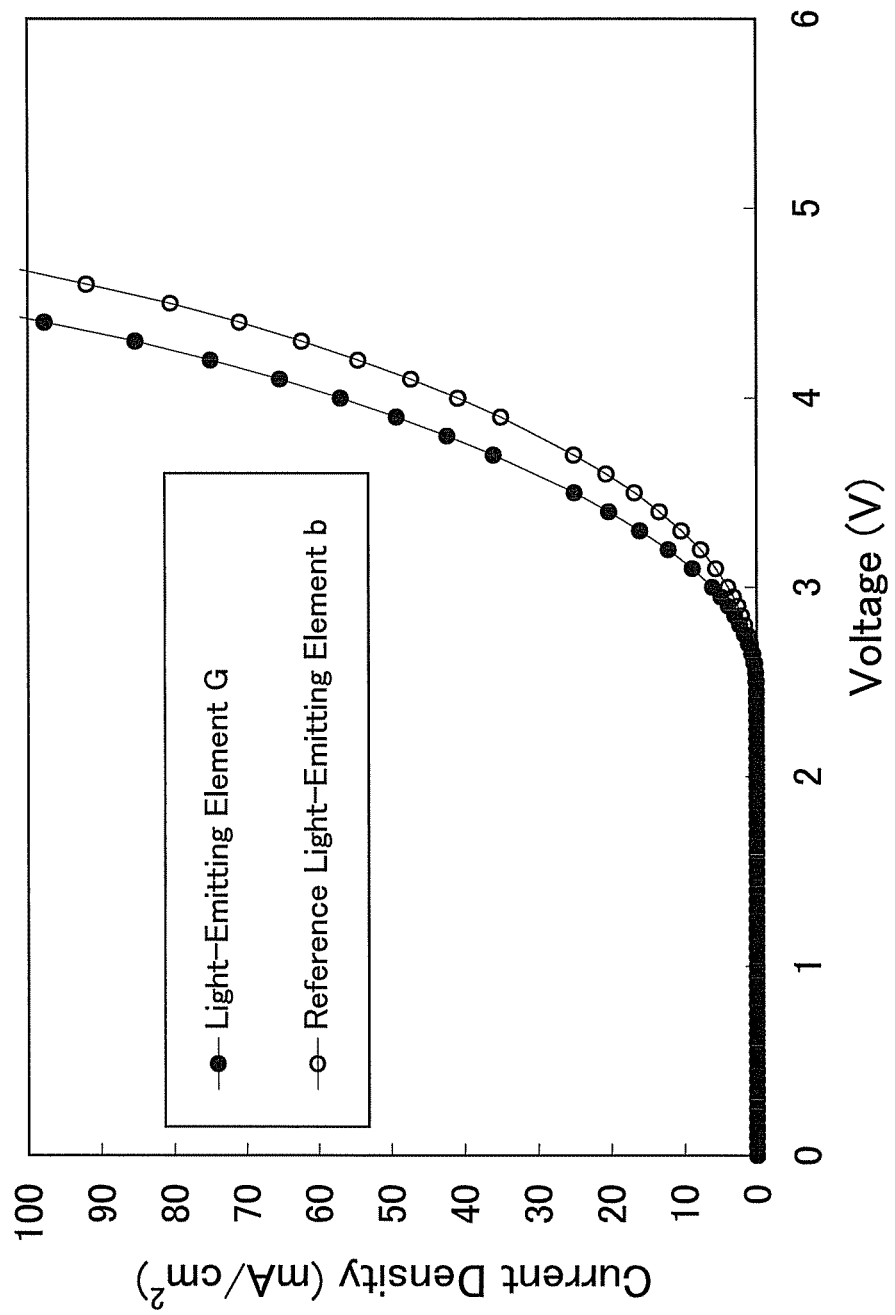
FIG. 15 is a graph showing characteristics of light-emitting elements of Example 2.

FIG. 14 and FIG. 15 respectively show voltage versus luminance characteristics and voltage versus current density characteristics of the light-emitting element G and the reference light-emitting element b. Table 4 lists main initial characteristics of each light-emitting element at around 1000 cd/m$^2$.

TABLE 4

| | Voltage (V) | Chromaticity (x, y) | Current Efficiency (cd/A) | External Quantum Efficiency (%) |
|---|---|---|---|---|
| Light-Emitting Element G | 3.0 | (0.29, 0.62) | 14 | 4.1 |
| Reference Light-Emitting Element b | 3.2 | (0.29, 0.62) | 15 | 4.4 |

It can be seen from FIG. 14 that a higher luminance can be obtained at the same voltage by the light-emitting element G with the second layer as compared to the reference light-emitting element b.

Also in the voltage versus current density characteristics shown in FIG. 15, a higher current density can be obtained at the same voltage by the light-emitting element G as compared to the reference light-emitting element b.

Referring to Table 4 at around 1000 cd/m$^2$, the driving voltage of the light-emitting element G (3.0 V) is lower than that of the reference light-emitting element b (3.2 V). As for the chromaticity, current efficiency, and external quantum efficiency, the light-emitting element G is equivalent or almost equivalent to the reference light-emitting element b.

The above-described results reveal that an increase of the driving voltage of the light-emitting element can be suppressed by the second layer.

Example 3

In Example 3, a light-emitting element according to one embodiment of the present invention will be described. In this example, a light-emitting element H and a reference light-emitting element c were formed, and voltage versus current density characteristics thereof were compared to each other. As a result, it was shown that the driving voltage of the light-emitting element H is lower than that of the reference light-emitting element c, and it was found that a second layer in the light-emitting element H exhibits a large effect.

A substance CuPc was used for the second layer in the light-emitting element H, whereas the second layer was not provided in the reference light-emitting element c.

In each of the light-emitting element H and the reference light-emitting element c, indium tin oxide containing silicon oxide, aluminum, a combination of NPB and molybdenum oxide, and a combination of BPhen and Li were used for a cathode, an anode, a first layer, and a third layer, respectively. In each EL layer, a combination of NPB and molybdenum oxide, NPB, a combination of CzPA and 2PCAPA, and Alq were used for a fifth layer, a hole-transport layer, a light-emitting layer, and a fourth layer, respectively. Structural formulae of the materials used in this example are illustrated in Example 1 and thus omitted here.

(Formation of Light-Emitting Element H and Reference Light-Emitting Element c)

First, indium tin oxide containing silicon or silicon oxide was deposited to a thickness of 110 nm over a glass substrate by a sputtering method to form the cathode (electrode area: 2 mm×2 mm).

Next, the glass substrate provided with the cathode was fixed to a substrate holder provided in a deposition chamber in a vacuum evaporation apparatus such that the side on which the cathode was formed faced downward. The vacuum evaporation apparatus was evacuated to about $10^{-4}$ Pa, and then, co-evaporation of 4,4'-bis[N-(1-naphthyl)-N-phenylamino]biphenyl (abbreviation: NPB) which is a substance having a high hole-transport property and molybdenum(VI) oxide which is an acceptor substance was performed, so that the first layer was formed. The thickness of the first layer was 60 nm, and the mass ratio of NPB to molybdenum(VI) oxide was adjusted to 4:1 (NPB:molybdenum oxide). Note that according to the co-evaporation, evaporation is carried out with the use of a plurality of evaporation sources at the same time in one process chamber.

Next, CuPc was deposited to a thickness of about 2 nm to form the second layer by an evaporation method using resistance heating. The substance CuPc was deposited in the light-emitting element H. The second layer was not provided in the reference light-emitting element c.

Next, BPhen and Li were co-deposited to form the third layer. The thickness of the third layer was 10 nm and the mass ratio of BPhen to Li was adjusted to 1:0.02 (BPhen:Li).

Next, tris(8-quinolinolato)aluminum(III) (abbreviation: Alq) was deposited to a thickness of 10 nm by an evaporation method using resistance heating to form the fourth layer.

Next, 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) were co-evaporated with the mass ratio of CzPA:2PCAPA=1:0.05 to form the light-emitting layer. The substance CzPA is a substance having an electron-transport property and 2PCAPA is a substance which exhibits green light emission. The thickness of the light-emitting layer was 30 nm.

Next, by an evaporation method using resistance heating, NPB was deposited to a thickness of 10 nm to form the hole-transport layer.

Next, 4,4'-bis[N-(1-naphthyl)-N-phenylamino]biphenyl (abbreviation: NPB) which is a substance having a high hole-transport property and molybdenum(VI) oxide which is an acceptor substance were co-evaporated to form the fifth layer. The thickness of the fifth layer was 30 nm, and the mass ratio of NPB to molybdenum(VI) oxide was adjusted to 4:1 (NPB:molybdenum oxide).

Next, aluminum was deposited to a thickness of 200 nm to form the anode. In this manner, the light-emitting element H and the reference light-emitting element c were formed.

Table 5 shows part of element structures of the light-emitting element H and the reference light-emitting element c. The light-emitting element H corresponds to the light-emitting element described in Embodiment 1, 2, 4, or 5. The structures of the anode, the fifth layer, the hole-transport layer, the light-emitting layer, and the fourth layer are the same throughout the light-emitting element H and the reference light-emitting element c, and thus description thereof is omitted in Table 5.

TABLE 5

| | Cathode | The first layer | The second layer | The third layer | * | Anode |
|---|---|---|---|---|---|---|
| Light-Emitting Element H | NITO (110 nm) | NPB:MoO$_x$ (4:1, 60 nm) | CuPc (2 nm) | BPhen:Li (1:0.02, 10 nm) | ** | Al (200 nm) |
| Reference Light-Emitting Element c | | | — | | | |

* The fifth layer, the hole-transport layer, the light emitting layer, and the fourth layer are omitted.

**The materials and thicknesses of the layers are omitted.

The light-emitting element H and the reference light-emitting element c thus obtained were put into a glove box under a nitrogen atmosphere and the light-emitting elements were sealed from atmospheric air. Then, the operation characteristics of the light-emitting elements were measured at room temperature (under an atmosphere kept at 25° C.). Green emission at a wavelength of around 520 nm from 2PCAPA which is the light-emitting substance was obtained from either light-emitting element.

Figure 16:
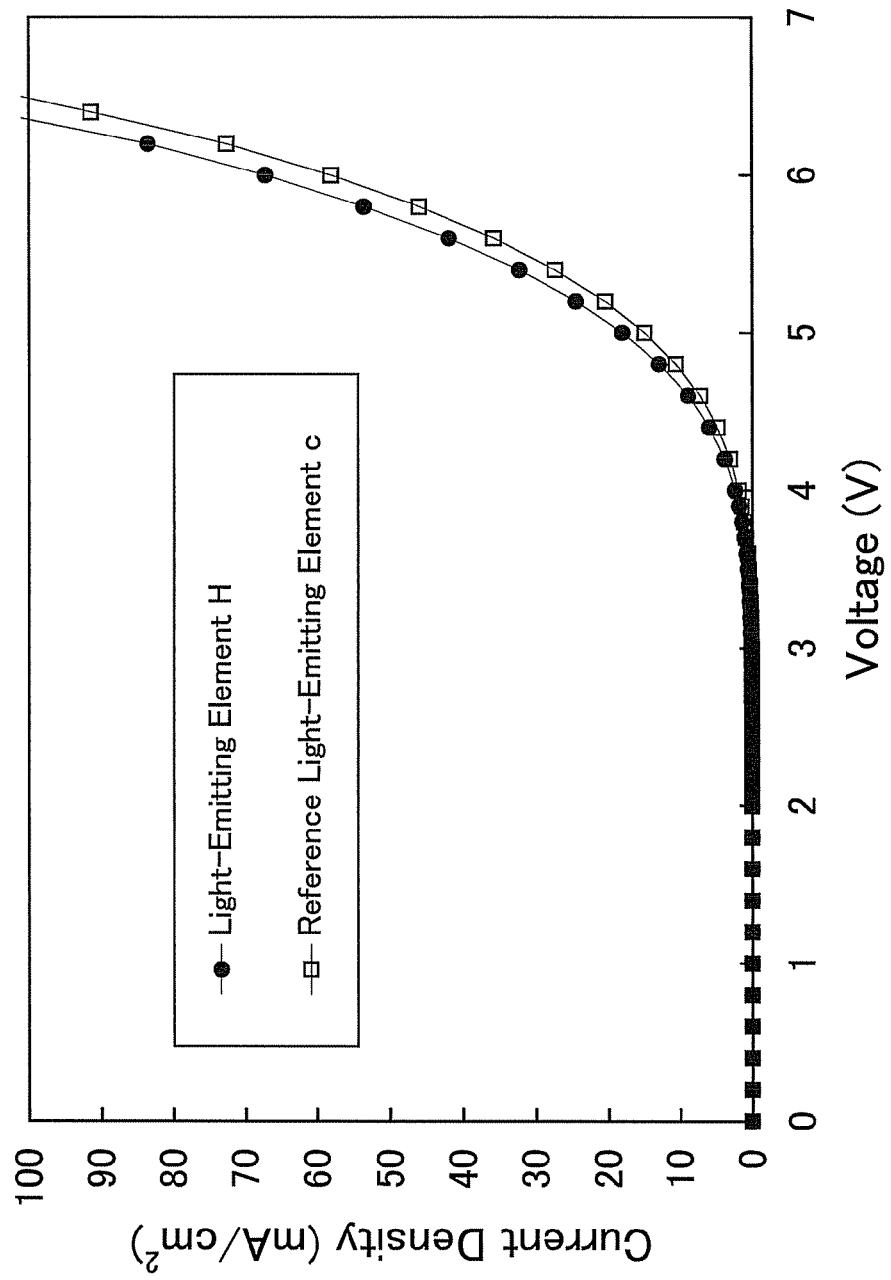
FIG. 16 is a graph showing characteristics of light-emitting elements of Example 3.

FIG. 16 shows voltage versus current density characteristics of the light-emitting element H and the reference light-emitting element c. Table 6 lists main initial characteristics of each light-emitting element at around 1000 cd/m$^2$.

TABLE 6

| | Voltage (V) | Chromaticity (x, y) | Current Efficiency (cd/A) | External Quantum Efficiency (%) |
|---|---|---|---|---|
| Light-Emitting Element H | 4.4 | (0.24, 0.60) | 15 | 4.8 |
| Reference Light-Emitting Element c | 4.6 | (0.24, 0.61) | 15 | 5.0 |

It can be seen from FIG. 16 that a higher current density can be obtained at the same voltage by the light-emitting element H as compared to the reference light-emitting element c.

Referring to Table 6 at around 1000 cd/m$^2$, the driving voltage of the light-emitting element H (4.4 V) is lower than that of the reference light-emitting element c (4.6 V). As for the chromaticity, current efficiency, and external quantum efficiency, the light-emitting element H is equivalent or almost equivalent to the reference light-emitting element c.

The above-described results reveal that an increase of the driving voltage of the light-emitting element can be suppressed by the second layer.

Example 4

In Example 4, a light-emitting element according to one embodiment of the present invention will be described. In this example, a light-emitting element I and a reference light-emitting element d were formed, and voltage versus luminance characteristics and voltage versus current density characteristics thereof were compared to each other. As a result, it was shown that the driving voltage of the light-emitting element I is lower than that of the reference light-emitting element d, and it was found that a second layer in the light-emitting element I exhibits a large effect.

A substance PhO-VOPc was used for the second layer in the light-emitting element I, whereas the second layer was not provided in the reference light-emitting element d.

In each of the light-emitting element I and the reference light-emitting element d, indium tin oxide containing silicon oxide, aluminum, a combination of NPB and molybdenum oxide, and lithium oxide ($Li_2O$) were used for an anode, a cathode, a first layer, and a third layer, respectively. In each EL layer, a combination of NPB and molybdenum oxide, NPB, a combination of CzPA and 2PCAPA, and a combination of Alq and BPhen were used for a fifth layer, a hole-transport layer, a light-emitting layer, and a fourth layer, respectively. Structural formulae of the materials used in this example are illustrated below. Note that the Structural formulae of the materials used in Example 1 are omitted here.

(Chemical Formula 6)

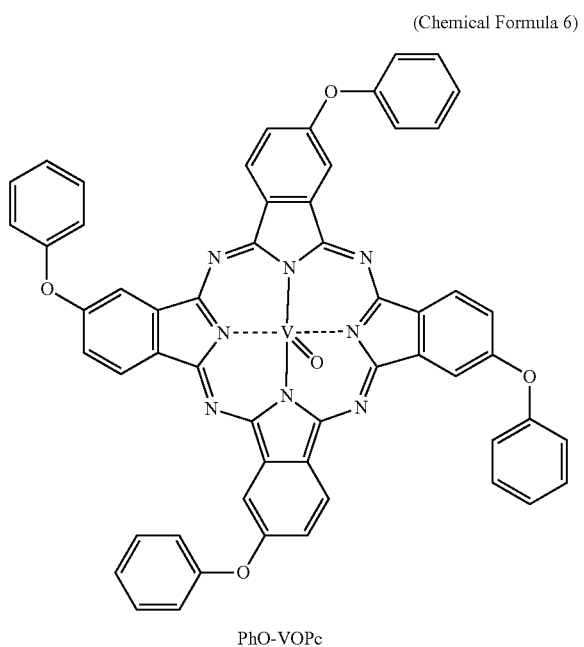

PhO-VOPc (Formation of Light-Emitting Element I and Reference Light-Emitting Element d)

First, indium tin oxide containing silicon or silicon oxide was deposited to a thickness of 110 nm over a glass substrate by a sputtering method to form the anode (electrode area: 2 mm×2 mm).

Next, the glass substrate provided with the anode was fixed to a substrate holder provided in a deposition chamber in a vacuum evaporation apparatus such that the side on which the anode was formed faced downward. The vacuum evaporation apparatus was evacuated to about $10^{-4}$ Pa, and then, co-evaporation of 4,4'-bis[N-(1-naphthyl)-N-phenylamino]bi-phenyl (abbreviation: NPB) which is a substance having a high hole-transport property and molybdenum(VI) oxide which is an acceptor substance was performed, so that the fifth layer was formed. The thickness of the firth layer was 50 nm, and the mass ratio of NPB to molybdenum(VI) oxide was adjusted to 4:1 (NPB:molybdenum oxide). Note that according to the co-evaporation, evaporation is carried out with the use of a plurality of evaporation sources at the same time in one process chamber.

Next, NPB was deposited to a thickness of 10 nm by an evaporation method using resistance heating to form the hole-transport layer.

Next, 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) were co-evaporated with the mass ratio of CzPA:2PCAPA=1:0.05 to form the light-emitting layer. The substance CzPA is a substance having an electron-transport property and 2PCAPA is a substance which exhibits green light emission. The thickness of the light-emitting layer was 30 nm.

Next, by an evaporation method using resistance heating, tris(8-quinolinolato)aluminum (abbreviation: Alq) was deposited to a thickness of 10 nm and then bathophenanthroline (abbreviation: BPhen) was deposited to a thickness of 10 nm to form the fourth layer.

Next, lithium oxide ($Li_2O$) was deposited to a thickness of about 0.1 nm to form the third layer by an evaporation method using resistance heating.

Next, PhO-VOPc was deposited to a thickness of about 3 nm to form the second layer by an evaporation method using resistance heating. The substance PhO-VOPc was deposited in the light-emitting element I. The second layer was not provided in the reference light-emitting element d.

Next, 4,4'-bis[N-(1-naphthyl)-N-phenylamino]biphenyl (abbreviation: NPB) which is a substance having a high hole-transport property and molybdenum(VI) oxide which is an acceptor substance were co-evaporated to form the first layer. The thickness of the first layer was 20 nm, and the mass ratio of NPB to molybdenum(VI) oxide was adjusted to 4:1 (NPB:molybdenum oxide).

Next, aluminum was deposited to a thickness of 200 nm to form the cathode. In this manner, the light-emitting element I and the reference light-emitting element d were formed.

Table 7 shows part of element structures of the light-emitting element I and the reference light-emitting element d. The light-emitting element I corresponds to the light-emitting element described in Embodiment 1, 2, 4, or 5. The structures of the anode, the fifth layer, the hole-transport layer, the light-emitting layer, and the fourth layer are the same throughout the light-emitting element I and the reference light-emitting element d, and thus description thereof is omitted in Table 7.

TABLE 7

|  | Anode | * | The third layer | The second layer | The first layer | Cathode |
|---|---|---|---|---|---|---|
| Light-Emitting Element I | NITO (110 nm) | ** | Li2O (0.1 nm) | PhO-VOPc (3 nm) | NPB:MoO$_x$ (4:1, 20 nm) | Al (200 nm) |
| Reference Light-Emitting Element d |  |  |  |  | — |  |

\* The fifth layer, the hole-transport layer, the light-emitting layer, and the fourth layer are omitted.
\*\*The materials and thicknesses of the layers are omitted.

The light-emitting element I and the reference light-emitting element d thus obtained were put into a glove box under a nitrogen atmosphere and the light-emitting elements were sealed from atmospheric air. Then, the operation characteristics of the light-emitting elements were measured at room temperature (under an atmosphere kept at 25° C.). Green emission at a wavelength of around 520 nm from 2PCAPA which is the light-emitting substance was obtained from each light-emitting element.

Figure 17:
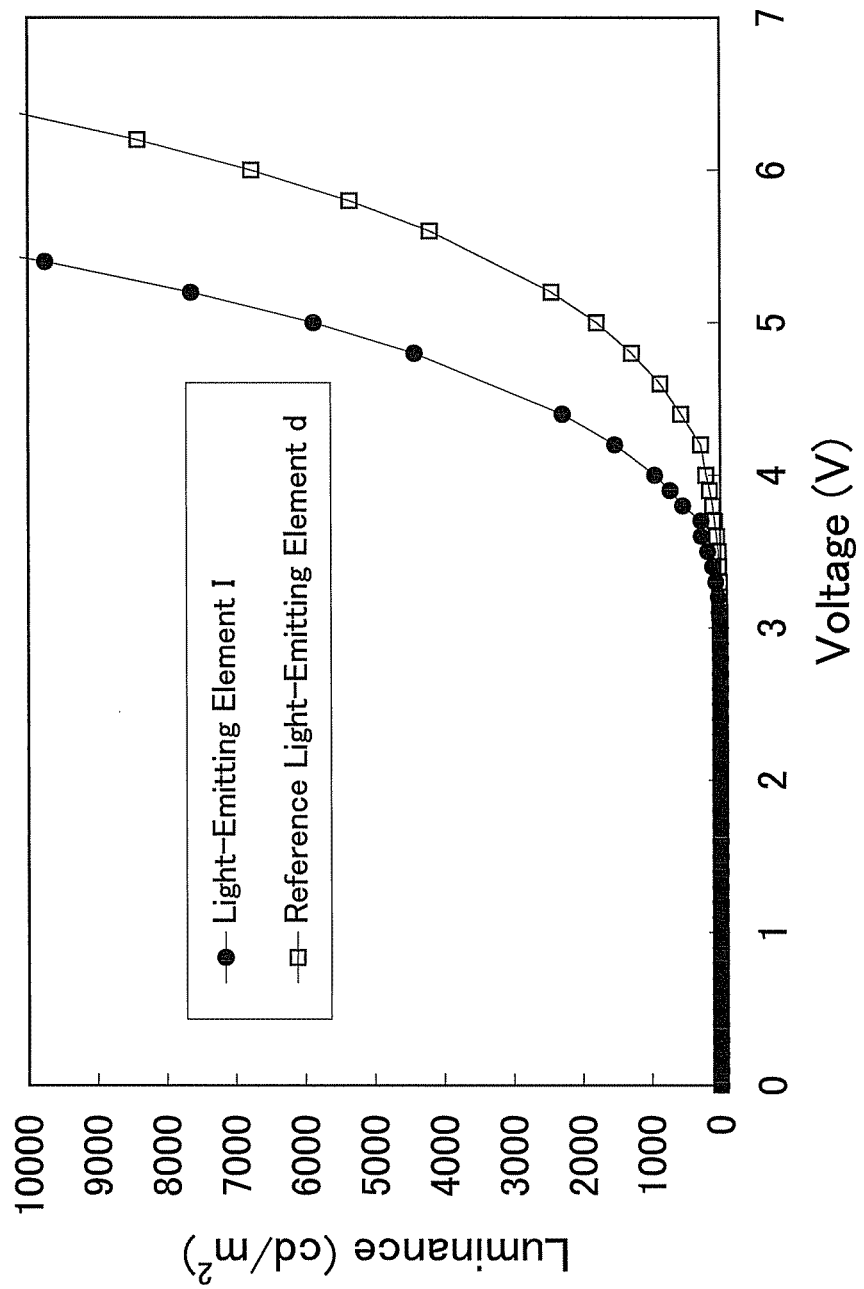
FIG. 17 is a graph showing characteristics of light-emitting elements of Example 4.
Figure 18:
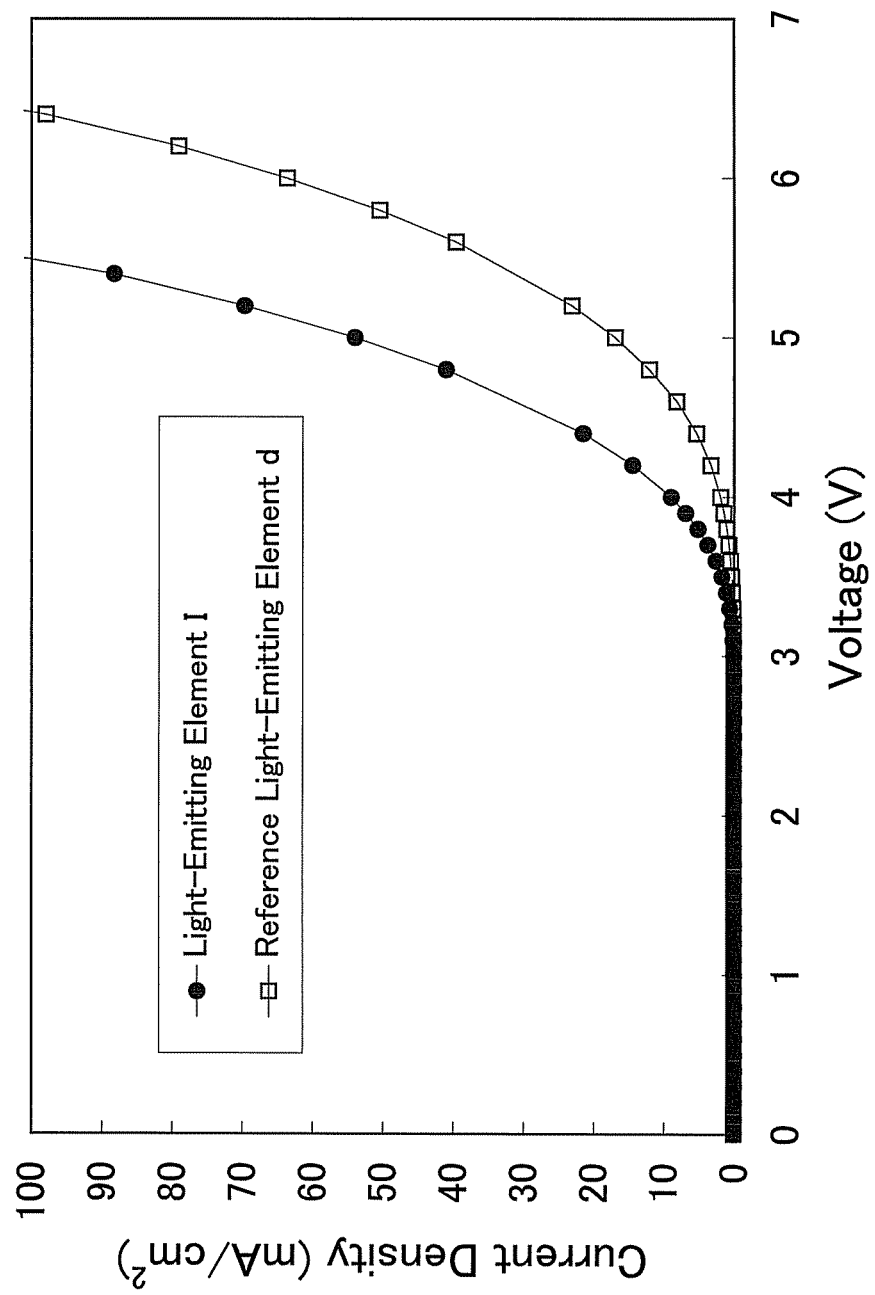
FIG. 18 is a graph showing characteristics of light-emitting elements of Example 4.

FIG. 17 and FIG. 18 respectively show voltage versus luminance characteristics and voltage versus current density characteristics of the light-emitting element I and the reference light-emitting element d. Table 8 lists main initial characteristics of each light-emitting element at around 1000 cd/m$^2$.

TABLE 8

|  | Voltage (V) | Chromaticity (x, y) | Current Efficiency (cd/A) | External Quantum Efficiency (%) |
|---|---|---|---|---|
| Light-Emitting Element I | 4.0 | (0.28, 0.58) | 10 | 3.3 |
| Reference Light-Emitting Element d | 4.6 | (0.27, 0.58) | 11 | 3.3 |

It can be seen from FIG. 17 that a higher luminance can be obtained at the same voltage by the light-emitting element I with the second layer as compared to the reference light-emitting element d.

Also in the voltage versus current density characteristics shown in FIG. 18, a higher current density can be obtained at the same voltage by the light-emitting element I as compared to the reference light-emitting element d.

Referring to Table 8 at around 1000 cd/m$^2$, the driving voltage of the light-emitting element I (4.0 V) is lower than that of the reference light-emitting element d (4.6 V). As for the chromaticity, current efficiency, and external quantum efficiency, the light-emitting element I is equivalent or almost equivalent to the reference light-emitting element d.

The above-described results reveal that an increase of the driving voltage of the light-emitting element can be suppressed by the second layer.

This application is based on Japanese Patent Application serial No. 2010-050451 filed with Japan Patent Office on Mar. 8, 2010, the entire content of which is hereby incorporated by reference.

What is claimed is:
1. A light-emitting element comprising:
an electroluminescence layer between an anode and a cathode;
a first layer between the cathode and the electroluminescence layer, the first layer including a substance having a hole-transport property;
a second layer between the cathode and the electroluminescence layer, the second layer consisting essentially of a phthalocyanine-based material represented by any one of the following structural formulae:

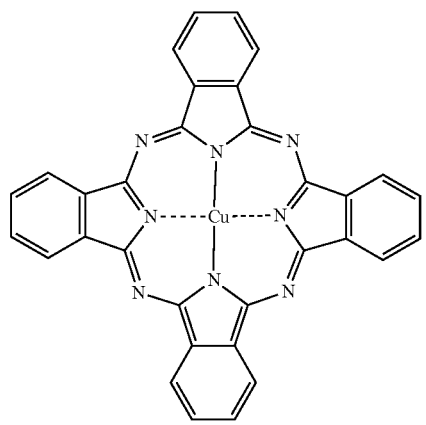

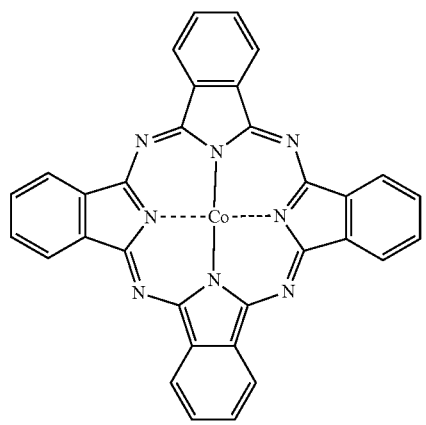

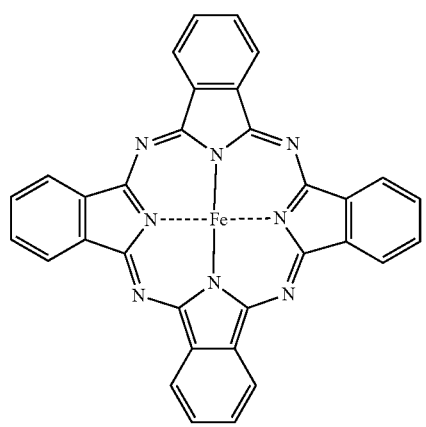

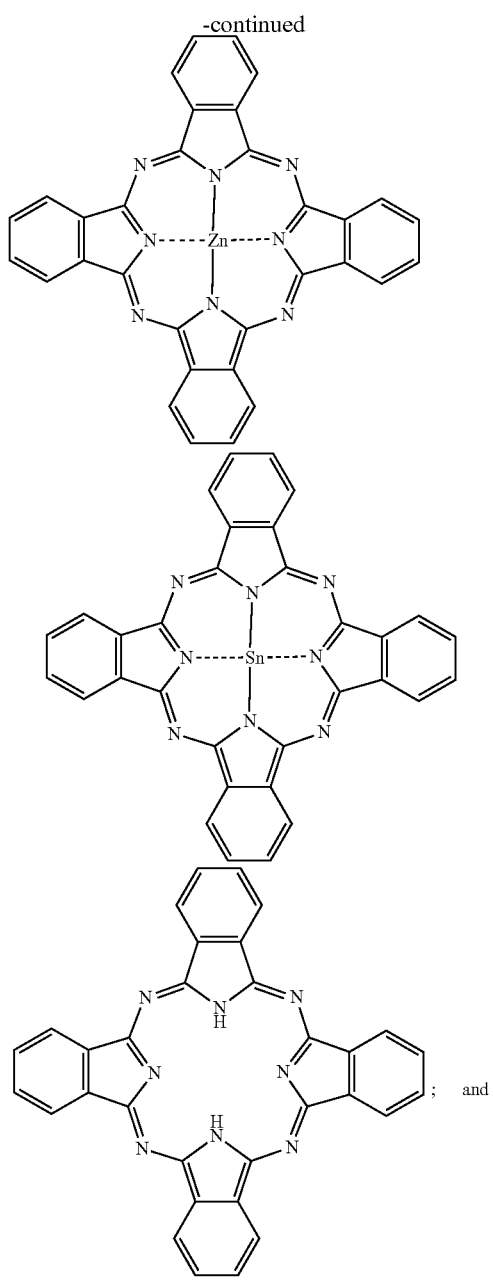
; and a third layer between the cathode and the electroluminescence layer, the third layer including one of an alkali metal, an alkaline-earth metal, a rare-earth metal, an alkali metal compound, an alkaline-earth metal compound, and a rare-earth metal compound, wherein the first layer is provided between the cathode and the second layer and in contact with the cathode and with the second layer, wherein the second layer is provided between the first layer and the third layer and in contact with the first layer and with the third layer, and wherein the third layer is provided between the second layer and the electroluminescence layer and in contact with the second layer and with the electroluminescence layer.

2. The light-emitting element according to claim 1,
wherein the third layer further includes a substance having an electron-transport property.

3. The light-emitting element according to claim 2,
wherein, in the third layer, a mass ratio of the one of the alkali metal, the alkaline-earth metal, the rare-earth metal, the alkali metal compound, the alkaline-earth metal compound, and the rare-earth metal compound to the substance having the electron-transport property is greater than or equal to 0.001:1 and less than or equal to 0.1:1.

4. The light-emitting element according to claim 1,
wherein the electroluminescence layer includes a fourth layer including a substance having an electron-transport property, and
wherein the fourth layer is in contact with the third layer.

5. The light-emitting element according to claim 1,
wherein the electroluminescence layer includes a fifth layer including a second substance having a hole-transport property and an acceptor substance with respect to the second substance having the hole-transport property, and
wherein the fifth layer is in contact with the anode.

6. The light-emitting element according to claim 5,
wherein a mass ratio of the acceptor substance to the second substance having the hole-transport property is greater than or equal to 0.1:1 and less than or equal to 4.0:1.

7. The light-emitting element according to claim 5,
wherein the fifth layer has a stack structure of a layer including the second substance having the hole-transport property and a layer including the acceptor substance.

8. A light-emitting device comprising the light-emitting element according to claim 1.

9. An electronic device comprising the light-emitting device according to claim 8.

10. A lighting device comprising the light-emitting device according to claim 8.

11. The light-emitting element according to claim 1, wherein the substance having the hole-transport property is aromatic amine compound or carbazole derivative.

12. The light-emitting element according to claim 1, wherein the substance having the hole-transport property is 4,4'-bis[N-(1-naphthyl)-N-phenylamino]biphenyl.

13. A light-emitting element comprising:
an electroluminescence layer between an anode and a cathode;
a first layer between the cathode and the electroluminescence layer, the first layer including a substance having a hole-transport property and an acceptor substance with respect to the substance having the hole-transport property;
a second layer between the cathode and the electroluminescence layer, the second layer consisting essentially of a phthalocyanine-based material represented by any one of the following structural formulae:

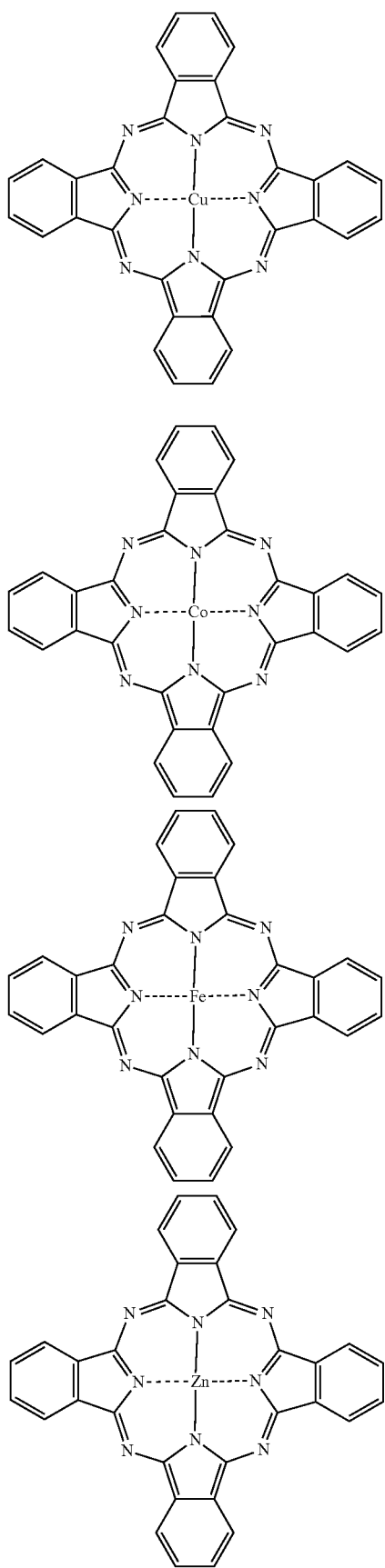

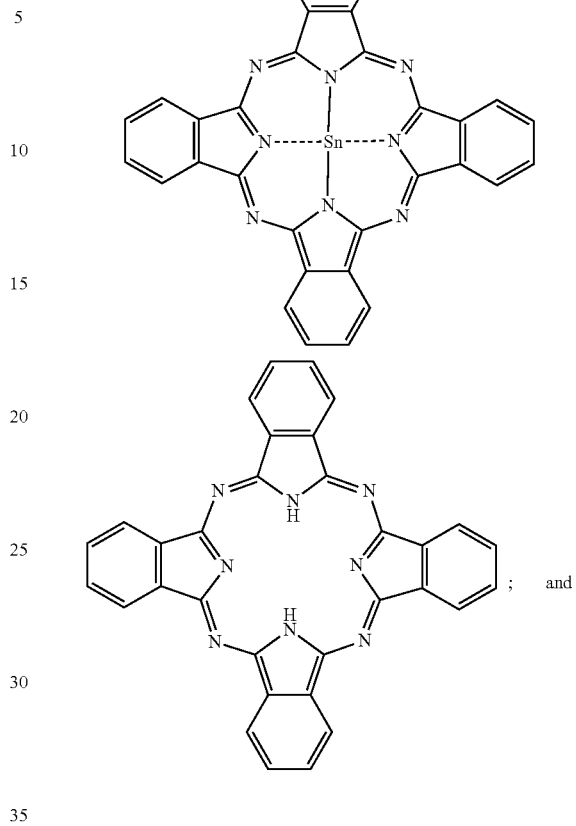

a third layer between the cathode and the electroluminescence layer, the third layer including one of an alkali metal, an alkaline-earth metal, a rare-earth metal, an alkali metal compound, an alkaline-earth metal compound, and a rare-earth metal compound, wherein the first layer is provided between the cathode and the second layer and in contact with the cathode and with the second layer, wherein the second layer is provided between the first layer and the third layer and in contact with the first layer and with the third layer, and wherein the third layer is provided between the second layer and the electroluminescence layer and in contact with the second layer and with the electroluminescence layer.

14. The light-emitting element according to claim 13, wherein the third layer further includes a substance having an electron-transport property.

15. The light-emitting element according to claim 14, wherein, in the third layer, a mass ratio of the one of the alkali metal, the alkaline-earth metal, the rare-earth metal, the alkali metal compound, the alkaline-earth metal compound, and the rare-earth metal compound to the substance having the electron-transport property is greater than or equal to 0.001:1 and less than or equal to 0.1:1.

16. The light-emitting element according to claim 13,
wherein the electroluminescence layer includes a fourth layer including a substance having an electron-transport property, and
wherein the fourth layer is in contact with the third layer.

17. The light-emitting element according to claim 13,
wherein, in the first layer, a mass ratio of the acceptor substance to the substance having the hole-transport property is greater than or equal to 0.1:1 and less than or equal to 4.0:1.

18. The light-emitting element according to claim 13,
wherein the first layer has a stack structure of a layer including the substance having the hole-transport property and a layer including the acceptor substance.

19. The light-emitting element according to claim 13,
wherein the electroluminescence layer includes a fifth layer including a second substance having a hole-transport property and a second acceptor substance with respect to the second substance having the hole-transport property, and
wherein the fifth layer is in contact with the anode.

20. The light-emitting element according to claim 19,
wherein a mass ratio of the second acceptor substance to the second substance having the hole-transport property is greater than or equal to 0.1:1 and less than or equal to 4.0:1.

21. The light-emitting element according to claim 19,
wherein the fifth layer has a stack structure of a layer including the second substance having the hole-transport property and a layer including the second acceptor substance.

22. The light-emitting element according to claim 13,
wherein the acceptor substance included in the first layer is an oxide of a metal belonging to Group 4 to Group 8 in a periodic table.

23. The light-emitting element according to claim 13,
wherein the acceptor substance included in the first layer is molybdenum oxide.

24. A light-emitting device comprising the light-emitting element according to claim 13.

25. An electronic device comprising the light-emitting device according to claim 24.

26. A lighting device comprising the light-emitting device according to claim 24.

27. The light-emitting element according to claim 13, wherein the substance having the hole-transport property is aromatic amine compound or carbazole derivative.

28. The light-emitting element according to claim 13, wherein the substance having the hole-transport property is 4,4'-bis[N-(1-naphthyl)-N-phenylamino]biphenyl.

29. A light-emitting element comprising:
an electroluminescence layer between an anode and a cathode;
a first layer between the cathode and the electroluminescence layer, the first layer including a substance having a hole-transport property;
a second layer between the cathode and the electroluminescence layer, the second layer consisting essentially of a phthalocyanine-based material represented following structural formula

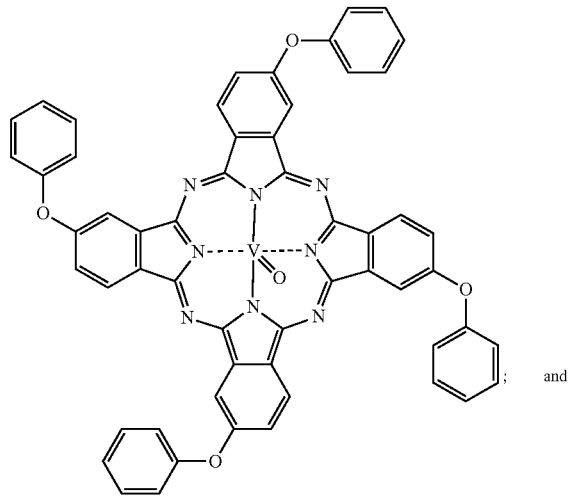

a third layer between the cathode and the electroluminescence layer, the third layer including one of an alkali metal, an alkaline-earth metal, a rare-earth metal, an alkali metal compound, an alkaline-earth metal compound, and a rare-earth metal compound,
wherein the first layer is provided between the cathode and the second layer and in contact with the cathode and with the second layer,
wherein the second layer is provided between the first layer and the third layer and in contact with the first layer and with the third layer, and
wherein the third layer is provided between the second layer and the electroluminescence layer and in contact with the second layer and with the electroluminescence layer.

30. The light-emitting element according to claim 29,
wherein the electroluminescence layer includes a fourth layer including a substance having an electron-transport property, and
wherein the fourth layer is in contact with the third layer.

31. The light-emitting element according to claim 29,
wherein the electroluminescence layer includes a fifth layer including a second substance having a hole-transport property and an acceptor substance with respect to the second substance having the hole-transport property, and
wherein the fifth layer is in contact with the anode.

32. A light-emitting device comprising the light-emitting element according to claim 29.

33. An electronic device comprising the light-emitting device according to claim 32.

34. A lighting device comprising the light-emitting device according to claim 32.

35. The light-emitting element according to claim 29,
wherein the first layer further comprises an acceptor substance with respect to the substance having the hole-transport property.

36. The light-emitting element according to claim 35,
wherein, in the first layer, a mass ratio of the acceptor substance to the substance having the hole-transport property is greater than or equal to 0.1:1 and less than or equal to 4.0:1.

37. The light-emitting element according to claim 35,
wherein the first layer has a stack structure of a layer including the substance having the hole-transport property and a layer including the acceptor substance.

38. The light-emitting element according to claim 35, wherein the acceptor substance included in the first layer is an oxide of a metal belonging to Group 4 to Group 8 in a periodic table.

39. The light-emitting element according to claim 35, wherein the acceptor substance included in the first layer is molybdenum oxide.

40. The light-emitting element according to claim 29, wherein the substance having the hole-transport property is aromatic amine compound or carbazole derivative.

41. The light-emitting element according to claim 29, wherein the substance having the hole-transport property is 4,4'-bis[N-(1-naphthyl)-N-phenylamino]biphenyl.

* * * * *